(12) United States Patent
Lewis et al.

(10) Patent No.: US 12,385,697 B2
(45) Date of Patent: Aug. 12, 2025

(54) MICROPILLAR-ENABLED THERMAL GROUND PLANE

(71) Applicant: Kelvin Thermal Technologies, Inc., Boulder, CO (US)

(72) Inventors: Ryan John Lewis, Boulder, CO (US); Li-Anne Liew, Westminster, CO (US); Ching-Yi Lin, Longmont, CO (US); Collin Jennings Coolidge, Longmont, CO (US); Shanshan Xu, Boulder, CO (US); Ronggui Yang, Boulder, CO (US); Yung-Cheng Lee, Boulder, CO (US)

(73) Assignee: Kelvin Thermal Technologies, Inc., Boulder, CO (US)

( * ) Notice: Subject to any disclaimer, the term of this patent is extended or adjusted under 35 U.S.C. 154(b) by 170 days.

(21) Appl. No.: 18/180,122

(22) Filed: Mar. 7, 2023

(65) Prior Publication Data
US 2023/0332841 A1    Oct. 19, 2023

Related U.S. Application Data

(63) Continuation-in-part of application No. 15/930,016, filed on May 12, 2020, now Pat. No. 11,598,594,
(Continued)

(51) Int. Cl.
*F28F 21/08*        (2006.01)
*F28D 15/02*        (2006.01)
*F28D 15/04*        (2006.01)

(52) U.S. Cl.
CPC ................... *F28D 15/046* (2013.01)

(58) Field of Classification Search
CPC .... F28D 15/046; F28D 15/04; F28D 15/0233; H05K 7/20336
See application file for complete search history.

(56) References Cited

U.S. PATENT DOCUMENTS 4,000,776 A    1/1977    Kroebig et al.
4,196,504 A    4/1980    Eastman
(Continued)

FOREIGN PATENT DOCUMENTS

CN    2522409 Y    11/2002
CN    2715467 Y    8/2005
(Continued)

OTHER PUBLICATIONS

Restriction Requirement dated Jul. 23, 2012 in U.S. Appl. No. 12/719,775, 9 pages.
(Continued)

*Primary Examiner* — Lionel Nouketcha

(57) ABSTRACT

A thermal ground plane (TGP) is disclosed. A TGP may include a first planar substrate member comprising copper and a second planar substrate member comprising a metal, wherein the first planar substrate member and the second planar substrate member enclose a working fluid. The TGP may include a first plurality of pillars disposed on an interior surface of the first planar substrate and a mesh layer disposed on the top of the first plurality of pillars, wherein the mesh layer comprises at least one of copper, polymer encapsulated with copper, or stainless steel encapsulated with copper. The TGP may also include a second plurality of pillars disposed on an interior surface of the second planar substrate member within an area defined by the perimeter of the second planar substrate member and the second plurality of pillars extend from the second planar substrate member to the mesh layer.

21 Claims, 20 Drawing Sheets
(11 of 20 Drawing Sheet(s) Filed in Color)

Related U.S. Application Data which is a continuation-in-part of application No. 14/857,567, filed on Sep. 17, 2015, now Pat. No. 10,731,925.

(60) Provisional application No. 62/069,564, filed on Oct. 28, 2014, provisional application No. 62/051,761, filed on Sep. 17, 2014.

(56) References Cited

U.S. PATENT DOCUMENTS

| | | | |
|---|---|---|---|
| 4,274,479 A | 6/1981 | Eastman | |
| 4,279,294 A | 7/1981 | Fitzpatrick et al. | |
| 4,545,799 A | 10/1985 | Rhodes et al. | |
| 4,854,379 A | 8/1989 | Shaubach et al. | |
| 5,000,256 A | 3/1991 | Tousignant | |
| 5,157,893 A | 10/1992 | Benson et al. | |
| 5,175,975 A | 1/1993 | Benson et al. | |
| 5,343,940 A | 9/1994 | Jean | |
| 5,360,058 A | 11/1994 | Koeppl et al. | |
| 5,560,423 A | 10/1996 | Larson et al. | |
| 5,735,339 A | 4/1998 | Davenport et al. | |
| 6,056,044 A | 5/2000 | Benson et al. | |
| 6,082,443 A | 7/2000 | Yamamoto et al. | |
| 6,139,974 A | 10/2000 | Atkinson et al. | |
| 6,158,502 A | 12/2000 | Thomas | |
| 6,269,866 B1 | 8/2001 | Yamamoto et al. | |
| 6,446,706 B1 | 9/2002 | Rosenfeld et al. | |
| 6,533,029 B1 | 3/2003 | Phillips | |
| 6,561,262 B1 | 5/2003 | Osakabe et al. | |
| 6,763,671 B1 | 7/2004 | Klett et al. | |
| 6,896,039 B2 | 5/2005 | Dussinger et al. | |
| 6,912,130 B2 | 6/2005 | Osanai et al. | |
| 6,938,481 B2 | 9/2005 | Paterek et al. | |
| 6,994,151 B2 | 2/2006 | Zhou et al. | |
| 7,028,713 B2 | 4/2006 | Koyama | |
| 7,037,400 B1 | 5/2006 | Shaw et al. | |
| 7,069,978 B2 | 7/2006 | Rosenfeld et al. | |
| 7,100,680 B2 | 9/2006 | Dussinger et al. | |
| 7,219,713 B2 | 5/2007 | Gelorme et al. | |
| 7,278,469 B2 | 10/2007 | Sasaki et al. | |
| 8,018,128 B2 | 9/2011 | Egawa et al. | |
| 8,069,907 B2 * | 12/2011 | Bryant | F28D 15/04 |
| | | | 361/679.52 |
| 8,560,031 B2 | 10/2013 | Barnett et al. | |
| 8,579,018 B1 | 11/2013 | Roper et al. | |
| 8,646,281 B2 | 2/2014 | Lim | |
| 8,807,203 B2 | 8/2014 | MacDonald et al. | |
| 8,921,702 B1 | 12/2014 | Carter et al. | |
| 8,985,197 B2 | 3/2015 | Wang | |
| 9,127,898 B2 | 9/2015 | Wong | |
| 9,149,896 B1 | 10/2015 | Batty et al. | |
| 9,163,883 B2 | 10/2015 | Yang et al. | |
| 9,597,657 B1 | 3/2017 | Zhamu et al. | |
| 9,600,041 B2 | 3/2017 | Ady et al. | |
| 9,651,312 B2 | 5/2017 | Yang et al. | |
| 9,700,930 B2 | 7/2017 | Yang | |
| 9,835,383 B1 | 12/2017 | Roper et al. | |
| 9,909,814 B2 | 3/2018 | Yang et al. | |
| 9,921,004 B2 | 3/2018 | Lewis et al. | |
| 10,066,876 B2 | 9/2018 | Zhou et al. | |
| 10,281,220 B1 | 5/2019 | Lin et al. | |
| 10,458,719 B2 | 10/2019 | Bozorgi et al. | |
| 10,527,358 B2 | 1/2020 | Yang et al. | |
| 10,544,994 B2 | 1/2020 | Wakaoka et al. | |
| 10,571,200 B2 | 2/2020 | Yang et al. | |
| 10,973,151 B2 | 4/2021 | Wakaoka et al. | |
| 10,980,148 B2 | 4/2021 | Cheng | |
| 11,054,189 B2 | 7/2021 | Salim Shirazy et al. | |
| 11,054,190 B2 | 7/2021 | Inagaki et al. | |
| 11,058,031 B2 | 7/2021 | Numoto et al. | |
| 11,150,030 B2 | 10/2021 | Kishimoto et al. | |
| 11,445,636 B2 | 9/2022 | Wakaoka et al. | |
| 2001/0054495 A1 | 12/2001 | Yevin et al. | |
| 2003/0042009 A1 | 3/2003 | Phillips | |
| 2003/0051859 A1 | 3/2003 | Chesser et al. | |
| 2003/0079863 A1 | 5/2003 | Sugito et al. | |
| 2003/0102118 A1 | 6/2003 | Sagal et al. | |
| 2003/0136547 A1 | 7/2003 | Gollan et al. | |
| 2003/0136550 A1 | 7/2003 | Tung et al. | |
| 2003/0136551 A1 | 7/2003 | Bakke | |
| 2003/0159806 A1 | 8/2003 | Sehmbey et al. | |
| 2004/0011509 A1 | 1/2004 | Siu | |
| 2004/0050533 A1 | 3/2004 | Chesser et al. | |
| 2004/0131877 A1 | 7/2004 | Hasz et al. | |
| 2004/0134548 A1 | 7/2004 | Koyama | |
| 2004/0211549 A1 | 10/2004 | Garner et al. | |
| 2004/0244951 A1 | 12/2004 | Dussinger et al. | |
| 2005/0059238 A1 | 3/2005 | Chen et al. | |
| 2005/0126757 A1 | 6/2005 | Bennett et al. | |
| 2005/0190810 A1 | 9/2005 | Butterworth et al. | |
| 2005/0230085 A1 | 10/2005 | Valenzuela | |
| 2005/0280128 A1 | 12/2005 | Mok et al. | |
| 2005/0280162 A1 | 12/2005 | Mok et al. | |
| 2006/0032615 A1 | 2/2006 | Dussinger et al. | |
| 2006/0037737 A1 | 2/2006 | Chen et al. | |
| 2006/0090882 A1 | 5/2006 | Sauciuc | |
| 2006/0098411 A1 | 5/2006 | Lee et al. | |
| 2006/0124280 A1 | 6/2006 | Lee et al. | |
| 2006/0131002 A1 | 6/2006 | Mochizuki et al. | |
| 2006/0162905 A1 | 7/2006 | Hsu | |
| 2006/0196640 A1 | 9/2006 | Siu | |
| 2006/0196641 A1 | 9/2006 | Hong et al. | |
| 2006/0213648 A1 | 9/2006 | Chen et al. | |
| 2006/0283574 A1 | 12/2006 | Huang | |
| 2006/0283576 A1 | 12/2006 | Lai et al. | |
| 2007/0006993 A1 | 1/2007 | Meng et al. | |
| 2007/0035927 A1 | 2/2007 | Erturk et al. | |
| 2007/0056714 A1 | 3/2007 | Wong | |
| 2007/0068657 A1 | 3/2007 | Yamamoto et al. | |
| 2007/0077165 A1 | 4/2007 | Hou et al. | |
| 2007/0089864 A1 | 4/2007 | Chang et al. | |
| 2007/0095507 A1 | 5/2007 | Henderson et al. | |
| 2007/0107875 A1 | 5/2007 | Lee et al. | |
| 2007/0107878 A1 | 5/2007 | Hou et al. | |
| 2007/0158050 A1 | 7/2007 | Norley et al. | |
| 2008/0017356 A1 | 1/2008 | Gruss et al. | |
| 2008/0029249 A1 | 2/2008 | Hsiao | |
| 2008/0067502 A1 | 3/2008 | Chakrapani et al. | |
| 2008/0111151 A1 | 5/2008 | Teraki et al. | |
| 2008/0128116 A1 | 6/2008 | Dangelo et al. | |
| 2008/0128898 A1 | 6/2008 | Henderson et al. | |
| 2008/0210407 A1 | 9/2008 | Kim et al. | |
| 2008/0224303 A1 | 9/2008 | Funakoshi et al. | |
| 2008/0272482 A1 | 11/2008 | Jensen et al. | |
| 2008/0283222 A1 | 11/2008 | Chang et al. | |
| 2009/0020269 A1 | 1/2009 | Chang et al. | |
| 2009/0020272 A1 | 1/2009 | Shimizu | |
| 2009/0025910 A1 | 1/2009 | Hoffman et al. | |
| 2009/0056917 A1 | 3/2009 | Majumdar et al. | |
| 2009/0151906 A1 | 6/2009 | Lai et al. | |
| 2009/0159242 A1 | 6/2009 | Zhao et al. | |
| 2009/0205812 A1 | 8/2009 | Meyer, IV et al. | |
| 2009/0236080 A1 | 9/2009 | Lin et al. | |
| 2009/0294104 A1 | 12/2009 | Lin et al. | |
| 2009/0316335 A1 | 12/2009 | Simon et al. | |
| 2010/0028604 A1 | 2/2010 | Bhushan et al. | |
| 2010/0053899 A1 | 3/2010 | Hashimoto et al. | |
| 2010/0071879 A1 | 3/2010 | Hou | |
| 2010/0084113 A1 | 4/2010 | Lee | |
| 2010/0139767 A1 | 6/2010 | Hsieh et al. | |
| 2010/0157535 A1 | 6/2010 | Oniki et al. | |
| 2010/0175854 A1 | 7/2010 | Gratton | |
| 2010/0200199 A1 | 8/2010 | Habib et al. | |
| 2010/0252237 A1 | 10/2010 | Hashimoto et al. | |
| 2010/0254090 A1 | 10/2010 | Trautman | |
| 2010/0290190 A1 | 11/2010 | Chester et al. | |
| 2010/0294200 A1 | 11/2010 | Zhang et al. | |
| 2010/0300656 A1 | 12/2010 | Lu et al. | |
| 2011/0017431 A1 | 1/2011 | Yang et al. | |
| 2011/0027311 A1 | 2/2011 | Deng et al. | |
| 2011/0083829 A1 | 4/2011 | Hung et al. | |
| 2011/0088873 A1 | 4/2011 | Yang | |
| 2011/0108142 A1 | 5/2011 | Liu et al. | |

(56) References Cited

U.S. PATENT DOCUMENTS

| | | | |
|---|---|---|---|
| 2011/0120674 A1* | 5/2011 | MacDonald | F28D 15/046 29/890.03 |
| 2011/0174474 A1 | 7/2011 | Liu et al. | |
| 2011/0198059 A1 | 8/2011 | Gavillet et al. | |
| 2011/0205708 A1 | 8/2011 | Andry et al. | |
| 2012/0037210 A1 | 2/2012 | Lim | |
| 2012/0048516 A1 | 3/2012 | He et al. | |
| 2012/0061127 A1 | 3/2012 | Fields et al. | |
| 2012/0168435 A1 | 7/2012 | Chen et al. | |
| 2012/0186784 A1 | 7/2012 | Yang et al. | |
| 2012/0189839 A1 | 7/2012 | Aoki et al. | |
| 2012/0241216 A1 | 9/2012 | Coppeta et al. | |
| 2012/0312504 A1 | 12/2012 | Suzuki et al. | |
| 2012/0325437 A1 | 12/2012 | Meyer, IV et al. | |
| 2013/0014919 A1 | 1/2013 | Dai et al. | |
| 2013/0043000 A1 | 2/2013 | Wang | |
| 2013/0049018 A1 | 2/2013 | Ramer et al. | |
| 2013/0168057 A1 | 7/2013 | Semenic et al. | |
| 2013/0199770 A1 | 8/2013 | Cherian | |
| 2013/0269913 A1* | 10/2013 | Ueda | F28D 15/0233 165/104.26 |
| 2013/0327504 A1 | 12/2013 | Bozorgi et al. | |
| 2014/0009883 A1 | 1/2014 | Fujiwara et al. | |
| 2014/0017456 A1 | 1/2014 | Xiao et al. | |
| 2014/0055954 A1 | 2/2014 | Wu | |
| 2014/0174700 A1 | 6/2014 | Lin et al. | |
| 2014/0174701 A1 | 6/2014 | Kare et al. | |
| 2014/0237823 A1 | 8/2014 | Yang | |
| 2014/0238645 A1 | 8/2014 | Enright | |
| 2014/0238646 A1 | 8/2014 | Enright | |
| 2014/0247556 A1 | 9/2014 | Eid et al. | |
| 2015/0000884 A1 | 1/2015 | Jiang et al. | |
| 2015/0181756 A1 | 6/2015 | Sato et al. | |
| 2015/0226493 A1 | 8/2015 | Yang et al. | |
| 2015/0237762 A1 | 8/2015 | Holt et al. | |
| 2015/0289413 A1 | 10/2015 | Rush et al. | |
| 2016/0018165 A1 | 1/2016 | Ahamed et al. | |
| 2016/0076820 A1 | 3/2016 | Lewis et al. | |
| 2016/0081227 A1 | 3/2016 | Lee et al. | |
| 2016/0123678 A1 | 5/2016 | Hulse et al. | |
| 2016/0131437 A1 | 5/2016 | Wu | |
| 2016/0161193 A1 | 6/2016 | Lewis et al. | |
| 2016/0216042 A1 | 7/2016 | Bozorgi et al. | |
| 2016/0295980 A1 | 10/2016 | Wu | |
| 2016/0343639 A1 | 11/2016 | Groothuis et al. | |
| 2017/0030654 A1 | 2/2017 | Yang et al. | |
| 2017/0064868 A1 | 3/2017 | Rush et al. | |
| 2017/0122672 A1 | 5/2017 | Lin | |
| 2017/0241717 A1 | 8/2017 | Sun et al. | |
| 2017/0292793 A1 | 10/2017 | Sun et al. | |
| 2017/0318702 A1 | 11/2017 | Basu et al. | |
| 2017/0343293 A1 | 11/2017 | Hurbi et al. | |
| 2017/0350657 A1 | 12/2017 | Yeh et al. | |
| 2018/0010861 A1 | 1/2018 | Wakaoka et al. | |
| 2018/0106554 A1 | 4/2018 | Lewis et al. | |
| 2018/0320984 A1 | 11/2018 | Lewis et al. | |
| 2018/0320985 A1 | 11/2018 | Salim Shirazy et al. | |
| 2019/0271511 A1 | 9/2019 | Kishimoto et al. | |
| 2019/0323780 A1 | 10/2019 | Ahamed et al. | |
| 2019/0390919 A1 | 12/2019 | Lewis et al. | |
| 2020/0003501 A1 | 1/2020 | Wakaoko | |
| 2020/0045847 A1 | 2/2020 | Wakaoko et al. | |
| 2020/0045848 A1 | 2/2020 | Wakaoko et al. | |
| 2020/0049421 A1 | 2/2020 | Wakaoko et al. | |
| 2020/0060044 A1 | 2/2020 | Numoto et al. | |
| 2020/0124352 A1 | 4/2020 | Wakaoko et al. | |
| 2020/0240718 A1 | 7/2020 | Wakaoko et al. | |
| 2021/0025061 A1 | 1/2021 | Yang et al. | |
| 2021/0136955 A1 | 5/2021 | Wakaoko et al. | |
| 2021/0148646 A1 | 5/2021 | Sun et al. | |
| 2022/0120510 A1 | 4/2022 | Wu et al. | |
| 2022/0128314 A1 | 4/2022 | Inagaki et al. | |
| 2022/0294485 A1 | 9/2022 | Li et al. | |
| 2023/0017904 A1 | 1/2023 | Lai et al. | |

FOREIGN PATENT DOCUMENTS

| | | |
|---|---|---|
| CN | 1672258 A | 9/2005 |
| CN | 1877241 A | 12/2006 |
| CN | 1957221 A | 5/2007 |
| CN | 101022718 A | 8/2007 |
| CN | 101080359 A | 11/2007 |
| CN | 101151950 A | 3/2008 |
| CN | 100480611 C | 4/2009 |
| CN | 100508708 C | 7/2009 |
| CN | 101754656 A | 6/2010 |
| CN | 102019543 A | 4/2011 |
| CN | 102066864 A | 5/2011 |
| CN | 202928418 U | 5/2013 |
| CN | 103398613 A | 11/2013 |
| CN | 103952729 A | 7/2014 |
| CN | 209930339 U | 1/2020 |
| DE | 19729922 C1 | 1/1999 |
| DE | 202009016739 U1 | 4/2010 |
| EP | 1369918 A2 | 12/2003 |
| EP | 1379825 A2 | 1/2004 |
| EP | 2713132 A1 | 4/2014 |
| GB | 2529512 A | 2/2016 |
| JP | H1197871 A | 4/1999 |
| JP | 2011080679 A | 4/2011 |
| JP | 2013148289 A | 8/2013 |
| JP | 2018204941 A | 12/2018 |
| JP | 2019016883 A | 1/2019 |
| TW | M544733 U | 7/2017 |
| WO | 03103835 A1 | 12/2003 |
| WO | 2006052763 A2 | 5/2006 |
| WO | 2006115326 A1 | 11/2006 |
| WO | 2006123049 A2 | 11/2006 |
| WO | 2007124028 A2 | 11/2007 |
| WO | 2008044823 A1 | 4/2008 |
| WO | 2008045004 A1 | 4/2008 |
| WO | 2008146129 A2 | 12/2008 |
| WO | 2009079084 A1 | 6/2009 |
| WO | 2010036442 A1 | 4/2010 |
| WO | 2013144444 A1 | 10/2013 |
| WO | 2015172136 A1 | 11/2015 |
| WO | 2015193153 A1 | 12/2015 |
| WO | 2016044180 A1 | 3/2016 |

OTHER PUBLICATIONS

Non-Final Office Action dated Nov. 9, 2012 in U.S. Appl. No. 12/719,775, 15 pages.
Final Office Action dated May 9, 2013 in U.S. Appl. No. 12/719,775, 15 pages.
Advisory Action dated Aug. 2, 2013 in U.S. Appl. No. 12/719,775, 4 pages.
Non-Final Office Action dated Oct. 2, 2013 in U.S. Appl. No. 12/719,775, 17 pages.
Final Office Action dated Mar. 26, 2014 in U.S. Appl. No. 12/719,775, 23 pages.
Advisory Action dated Jun. 20, 2014 in U.S. Appl. No. 12/719,775, 4 pages.
Non-Final Office Action dated Feb. 6, 2015 in U.S. Appl. No. 12/719,775, 24 pages.
Restriction Requirement dated Jul. 28, 2015 in U.S. Appl. No. 14/681,624, 5 pages.
Notice of Allowance in dated Aug. 4, 2015 U.S. Appl. No. 12/719,775, 9 pages.
Non-Final Office Action dated Oct. 23, 2015 in U.S. Appl. No. 14/681,624, 11 pages.
International Search Report and Written Opinion dated Dec. 18, 2015 as received in PCT Application No. PCT/US2015/050031, 13 pages.
International Search Report and Written Opinion dated Dec. 18, 2015 as received in PCT Application No. PCT/US2015/050771, 13 pages.
Final Office Action dated May 5, 2016 in U.S. Appl. No. 14/681,624, 11 pages.
International Search Report and Written Opinion mailed dated Jul. 15, 2016 as received in PCT Application No. PCT/US2015/057885, 10 pages.

(56) References Cited

OTHER PUBLICATIONS

Notice of Allowance dated Nov. 17, 2016 in U.S. Appl. No. 14/681,624, 7 pages.
International Preliminary Report on Patentability dated Mar. 21, 2017 as received in PCT Application No. PCT/US2015/050031, 8 pages.
International Preliminary Report on Patentability dated Mar. 21, 2017 as received in PCT Application No. PCT/US2015/050771, 6 pages.
International Preliminary Report on Patentability dated May 2, 2017 as received in PCT Application No. PCT/US2015/057885, 5 pages.
Preinterview First Office Action dated May 9, 2017 in U.S. Appl. No. 14/861,708, 9 pages.
Non-Final Office Action dated Aug. 9, 2017 in U.S. Appl. No. 14/925,787, 16 pages.
Restriction Requirement dated Aug. 30, 2017 in U.S. Appl. No. 14/853,833, 7 pages.
Final Office Action dated Sep. 28, 2017 in U.S. Appl. No. 14/925,787, 9 pages.
Non-Final Office Action dated Oct. 6, 2017 in U.S. Appl. No. 14/853,833, 13 pages.
Notice of Allowance dated Oct. 25, 2017 in U.S. Appl. No. 14/861,708, 9 pages.
Notice of Allowance dated Nov. 9, 2017 in U.S. Appl. No. 14/925,787, 7 pages.
Preinterview First Office Action dated Nov. 21, 2017 in U.S. Appl. No. 14/857,567, 12 pages.
International Search Report and Written Opinion mailed dated Jan. 17, 2018 as received in PCT Application No. PCT/US2017/060550, 13 pages.
Extended European search report Application mailed Feb. 22, 2018, as received in EP Application No. 15842101.6, 7 pages.
Final Office Action dated Mar. 8, 2018 in U.S. Appl. No. 14/857,567, 25 pages.
Extended European search report mailed Mar. 26, 2018, as received in EP Application No. 15841403.7, 10 pages.
Final Office Action dated Apr. 25, 2018 in U.S. Appl. No. 14/853,833, 12 pages.
First Office Action mailed May 9, 2018, as received in CN Application No. 201580049534, 13 pages.
Advisory Action dated May 30, 2018 in U.S. Appl. No. 14/857,567, 7 pages.
Non-Final Office Action dated Aug. 2, 2018 in U.S. Appl. No. 14/857,567, 30 pages.
First Office Action mailed Aug. 28, 2018, as received in CN Application No. 201580059333, 10 pages.
Restriction Requirement dated Aug. 30, 2018 in U.S. Appl. No. 15/292,932, 5 pages.
Non-Final Office Action dated Sep. 27, 2018 in U.S. Appl. No. 15/787,455, 15 pages.
Restriction Requirement dated Oct. 10, 2018 in U.S. Appl. No. 15/436,632, 5 pages.
International Search Report and Written Opinion mailed dated Oct. 15, 2018 received in PCT Application No. PCT/US2018/031632, 15 pages.
Final Office Action dated Oct. 30, 2018 in U.S. Appl. No. 14/857,567, 28 pages.
Non-Final Office Action dated Nov. 19, 2018 in U.S. Appl. No. 14/853,833, 11 pages.
Non-Final Office Action dated Dec. 11, 2018 in U.S. Appl. No. 15/292,932, 13 pages.
Second Office Action mailed Dec. 29, 2018, as received in CN Application No. 201580049534, 14 pages.
Non-Final Office Action dated Feb. 5, 2019 in U.S. Appl. No. 15/436,632, 10 pages.
Non-Final Office Action dated Mar. 21, 2019 in U.S. Appl. No. 14/857,567, 28 pages.
Final Office Action dated Mar. 29, 2019 in U.S. Appl. No. 14/853,833, 12 pages.
Final Office Action dated Mar. 29, 2019 in U.S. Appl. No. 15/292,932, 13 pages.
Final Office Action dated Apr. 1, 2019 in U.S. Appl. No. 15/787,455, 20 pages.
Non-Final Office Action dated Apr. 5, 2019 in U.S. Appl. No. 15/806,723, 12 pages.
International Preliminary Report on Patentability dated May 14, 2019 as received in PCT Application No. PCT/US2017/060550, 7 pages.
Final Office Action dated May 28, 2019 in U.S. Appl. No. 15/436,632, 14 pages.
Advisory Action dated Jul. 19, 2019 in U.S. Appl. No. 15/292,932, 4 pages.
Advisory Action dated Aug. 22, 2019 in U.S. Appl. No. 15/787,455, 4 pages.
Final Office Action dated Aug. 26, 2019 in U.S. Appl. No. 14/857,567, 27 pages.
Notice of Allowance dated Sep. 12, 2019 in U.S. Appl. No. 15/292,932, 7 pages.
Non-Final Office Action dated Sep. 17, 2019 in U.S. Appl. No. 15/787,455, 20 pages.
Notice of Allowance dated Oct. 10, 2019 in U.S. Appl. No. 15/436,632, 10 pages.
Final Office Action dated Oct. 11, 2019 in U.S. Appl. No. 15/806,723, 18 pages.
Advisory Action dated Nov. 7, 2019 in U.S. Appl. No. 14/857,567, 7 pages.
International Preliminary Report on Patentability dated Nov. 12, 2019 received in PCT Application No. PCT/US2018/031632, 7 pages.
Non-Final Office Action dated Nov. 29, 2019 in U.S. Appl. No. 14/857,567, 32 pages.
Advisory Action dated Feb. 3, 2020 in U.S. Appl. No. 15/806,723, 5 pages.
Restriction Requirement dated Feb. 13, 2020 in U.S. Appl. No. 15/974,306, 5 pages.
Office Action mailed Feb. 18, 2020, as received in EP Application No. 15841403.7, 4 pages.
Final Office Action dated Feb. 18, 2020 in U.S. Appl. No. 15/787,455, 17 pages.
Non-Final Office Action dated Mar. 18, 2020 in U.S. Appl. No. 15/806,723, 6 pages.
International Search Report and Written Opinion dated Apr. 8, 2020 as received in PCT Application No. PCT/US2019/065701, 16 pages.
Office Action mailed Apr. 9, 2020, as received in EP Application No. 15842101.6, 7 pages.
Notice of Allowance dated Apr. 15, 2020 in U.S. Appl. No. 14/857,567, 13 pages.
Notice of Allowance dated Apr. 20, 2020 in U.S. Appl. No. 15/806,723, 8 pages.
Advisory Action dated May 1, 2020 in U.S. Appl. No. 15/787,455, 4 pages.
Non-Final Office Action dated May 29, 2020 in U.S. Appl. No. 15/974,306, 11 pages.
First Office Action received Jun. 1, 2020, in related CN application No. 201910233277.1, 18 Pages.
First Office Action mailed Jun. 4, 2020, as received in CN Application No. 201580050472, 15 pages.
Extended European search report Application mailed Jun. 12, 2020, as received in EP Application No. 17870153.8, 9 pages.
First Office Action mailed Jul. 24, 2020, as received in CN Application No. 201910754250, 19 pages.
International Search Report and Written Opinion Application mailed Jul. 13, 2020, as received in PCT Application No. PCT/US2020/030911, 9 pages.
First Office Action mailed Sep. 24, 2020, as received in CN Application No. 201880030856, 19 pages.
Restriction Requirement dated Oct. 14, 2020 in U.S. Appl. No. 16/539,848, 8 pages.
Non-Final Office Action dated Oct. 26, 2020 in U.S. Appl. No. 16/539,848, 13 pages.
Office Action mailed Nov. 17, 2020, as received in EP Application No. 15842101.6, 5 pages.

(56) References Cited

OTHER PUBLICATIONS

Office Action mailed Nov. 18, 2020, as received in EP Application No. 15841403.7, 5 pages.
Extended European search report Application mailed Dec. 16, 2020, as received in EP Application No. 18798835.7, 8 pages.
Final Office Action dated Jan. 11, 2021 in U.S. Appl. No. 15/974,306, 12 pages.
Final Office Action dated Feb. 2, 2021 in U.S. Appl. No. 16/539,848, 10 pages.
Second Office Action mailed Mar. 16, 2021, as received in CN Application No. 201910233277.1, 21 pages.
Restriction Requirement dated Apr. 9, 2021 in U.S. Appl. No. 16/710,180, 8 pages.
Advisory Action dated Apr. 9, 2021 in U.S. Appl. No. 16/539,848, 4 pages.
Advisory Action dated Apr. 16, 2021 in U.S. Appl. No. 15/974,306, 4 pages.
Third Office Action mailed Apr. 19, 2021, as received in CN Application No. 201580049534, 7 pages.
Non-Final Office Action dated May 11, 2021 in U.S. Appl. No. 16/539,848, 10 pages.
Non-Final Office Action dated May 17, 2021 in U.S. Appl. No. 15/974,306, 9 pages.
International Preliminary Report on Patentability dated Jun. 8, 2021 as received in PCT Application No. PCT/US2019/065701, 7 pages.
Restriction Requirement dated Jun. 9, 2021 in U.S. Appl. No. 16/680,480, 6 pages.
Non-Final Office Action dated Jul. 9, 2021 in U.S. Appl. No. 15/930,016, 18 pages.
Final Office Action dated Dec. 17, 2021 in U.S. Appl. No. 15/930,016, 19 pages.
Restriction Requirement dated Jul. 19, 2021 in U.S. Appl. No. 16/710,180, 7 pages.
Restriction Requirement dated Aug. 30, 2021 in U.S. Appl. No. 17/352,250, 7 pages.
Notice of Allowance dated Sep. 9, 2021 in U.S. Appl. No. 15/787,455, 8 pages.
Non-Final Office Action in U.S. Appl. No. 16/864,236 dated Nov. 29, 2023, 11 pages.
Non-Final Office Action dated Oct. 5, 2021 in U.S. Appl. No. 16/680,480, 12 pages.
Non-Final Office Action in U.S. Appl. No. 16/710,180 dated Dec. 13, 2021, 14 pages.
International Search Report and Written Opinion in PCT Application No. PCT/US2021/038152 mailed on Sep. 29, 2021, 14 pages.
Advisory Action dated Feb. 9, 2022 in U.S. Appl. No. 16/539,848, 4 pages.
Restriction Requirement in U.S. Appl. No. 16/864,236 dated Feb. 7, 2022, 8 pages.
Final Office Action in U.S. Appl. No. 16/539,848 dated Nov. 29, 2021, 11 pages.
Non-Final Office Action in U.S. Appl. No. 16/539,848 dated Mar. 28, 2022, 11 pages.
Final Office Action in U.S. Appl. No. 16/710,180 dated Apr. 7, 2022, 15 pages.
Notice of Allowance dated Feb. 28, 2022 in U.S. Appl. No. 16/680,480, 9 pages.
Final Office Action in U.S. Appl. No. 15/787,455 dated Feb. 24, 2022, 24 pages.
Non-Final Office Action dated Nov. 5, 2021 in U.S. Appl. No. 17/352,250, 17 pages.
Final Office Action in U.S. Appl. No. 17/352,250 dated Mar. 11, 2022, 17 pages.
Non-Final Office Action dated Nov. 8, 2021 in U.S. Appl. No. 15/787,455, 17 pages.
Non-Final Office Action in U.S. Appl. No. 16/864,236 mailed on Oct. 6, 2022, 11 pages.
China Office Action in CN Application No. 201780082663.4 dated Sep. 20, 2022, 22 pages.
Non-Final Office Action in U.S. Appl. No. 17/529,248 mailed on Dec. 22, 2022, 9 pages.
Advisory Action in U.S. Appl. No. 16/710,180 dated Sep. 23, 2022, 3 pages.
Final Office Action in U.S. Appl. No. 16/710,180 dated Nov. 14, 2022, 14 pages.
Advisory Action in U.S. Appl. No. 16/539,848 dated Nov. 28, 2022, 3 pages.
Final Office Action in U.S. Appl. No. 16/539,848 dated Sep. 13, 2022, 11 pages.
Non-Final Office Action in U.S. Appl. No. 16/539,848 dated Dec. 29, 2022, 12 pages.
Non-Final Office Action in U.S. Appl. No. 15/930,016 dated Jul. 27, 2022, 16 pages.
Notice of Allowance in U.S. Appl. No. 15/930,016 dated Dec. 1, 2022, 9 pages.
Final Office Action dated May 17, 2023 in U.S. Appl. No. 16/539,848, 10 pages.
Final Office Action in U.S. Appl. No. 16/710,180 dated Mar. 24, 2023, 14 pages.
Final Office Action in U.S. Appl. No. 16/864,236 mailed on Apr. 10, 2023, 11 pages.
Final Office Action in U.S. Appl. No. 17/529,248 mailed on Apr. 25, 2023, 7 pages.
Restriction Requirement dated Apr. 20, 2023 in U.S. Appl. No. 17/666,537, 6 pages.
Non-Final Office Action in U.S. Appl. No. 17/666,537 dated Aug. 1, 2023, 10 pages.
Notice of Allowance in U.S. Appl. No. 17/666,537 dated Feb. 15, 2024, 9 pages.
Restriction Requirement in U.S. Appl. No. 17/592,490 dated Jun. 10, 2024, 8 pages.
Non-Final Office Action in U.S. Appl. No. 17/592,490 dated Nov. 19, 2024, 17 pages.
International Search Report and Written Opinion in PCT Application No. PCT/US2024/027116 mailed on Sep. 4, 2024, 12 pages.
Junjiao, H., et al., "Development of heat pipe cooling technology in high heat flux electronic components", Chemical Industry and Engineering Progress, Chemical Industry and Engineering Progress, vol. 34, Issue. 5, pp. 1220-1231 (May 5, 2015).
Restriction Requirement in U.S. Appl. No. 18/666,811 dated Dec. 5, 2024, 5 pages.
Non-Final Office Action in U.S. Appl. No. 17/951,075 mailed on Jun. 4, 2024, 21 pages.
Final Office Action in U.S. Appl. No. 17/951,075 mailed on Nov. 20, 2024, 20 pages.
Restriction Requirement in U.S. Appl. No. 18/004,059 dated May 2, 2024, 7 pages.
Restriction Requirement in U.S. Appl. No. 18/004,059 dated Sep. 30, 2024, 7 pages.
Final Office Action in U.S. Appl. No. 16/864,236 mailed on Jun. 7, 2024, 11 pages.
Non-Final Office Action in U.S. Appl. No. 16/864,236 mailed on Dec. 20, 2024, 13 pages.

\* cited by examiner

*(Section A)*

*(Section B)*

*(Section C)*

MICROPILLAR-ENABLED THERMAL GROUND PLANE

CROSS-REFERENCE TO RELATED APPLICATIONS

This application is a continuation in part of patent application Ser. No. 14/857,567, filed Sep. 17, 2015, titled MICROPILLAR-ENABLED THERMAL GROUND PLANE, which claims priority from U.S. Provisional Patent Application No. 62/051,761, filed Sep. 17, 2014, titled MICROPILLAR-ENABLED THERMAL GROUND PLANE; and a non-provisional of U.S. Provisional Patent Application No. 62/069,564, filed Oct. 28, 2014, titled POLYMER-BASED MICROFABRICATED THERMAL GROUND PLANE, each of which are incorporated into this disclosure by reference in their entireties.

SUMMARY

A thermal ground plane (TGP) is disclosed. The TGP may include a first planar substrate member configured to enclose a working fluid; a second planar substrate member configured to enclose the working fluid; a plurality of wicking structures disposed on the first planar substrate; and one or more planar spacers disposed on the second planar substrate. The first planar substrate and the second planar substrate may be hermetically sealed.

In some embodiments, the plurality of wicking structures comprise a plurality of pillars or channels disposed on the first planar substrate member and/or the plurality of wicking structures comprise a plurality of pillars or channels formed on the second planar substrate member.

In some embodiments, the first planar substrate member and/or the second planar substrate member comprise a metallic layer, a copper-cladded polymer layer with thermal vias, a copper-cladded polymer layer without thermal vias, a polymer-coated copper layer, a metallic layer encapsulated by a hydrophilic coating, a copper metallic layer encapsulated by a hydrophilic hydrophobic coating, and/or a polymer layer encapsulated by a metallic layer, a polymer layer encapsulated by a hydrophilic coating, and/or a polymer layer encapsulated by a hydrophobic coating. In some embodiments, the first planar substrate member (e.g., a metal cladding layer) and/or the second planar substrate member may be thicker in one or more regions such as, for example, regions near the evaporator or the condenser.

In some embodiments, the plurality of wicking structures comprise a plurality of copper pillars bonded with a mesh layer.

In some embodiments, the plurality of wicking structures may comprise a material with at least one property selected from the list consisting of copper mesh, stainless steel mesh, metal mesh, polymer mesh, copper-encapsulated mesh, a mesh encapsulated by a hydrophilic coating, a mesh encapsulated by a hydrophobic coating, and a mesh encapsulated by a hermetic seal.

In some embodiments, the plurality of wicking structures comprise copper pillars bonded with a stainless steel mesh encapsulated by copper or a copper mesh.

In some embodiments, the one or more planar spacers comprise copper pillars bonded with a stainless steel mesh encapsulated by copper or a copper mesh.

In some embodiments, the one or more planar spacers comprise a plurality of copper pillars or channels.

In some embodiments, the one or more planar spacers comprise a plurality of pillars or channels with various star-shaped cross sections, such as rectangular, circular, and/or star-shaped.

In some embodiments, the plurality of wicking structures comprise polymer pillars hermetically sealed by copper or other coatings, and/or enhanced with a hydrophilic coating or a hydrophobic coating.

In some embodiments, the plurality of wicking structures comprise a mesh layer. The mesh layer, for example, may include a mesh selected from the list consisting of copper mesh, stainless steel mesh, metal mesh, polymer mesh and copper-encapsulated mesh. The mesh layer, for example, may include a hydrophilic coating or a hydrophobic coating or hermetic coating.

In some embodiments, the plurality of wicking structures and/or the one or more planar spacers are deposited using a lithographic patterning process.

In some embodiments, the hermetical seal can be an ultrasound-welded, an electrostatic-welded, or a laser-welded copper-to-copper interface.

In some embodiments, the hermetical seal can include a seal selected from the list consisting of a copper-silver sintered interface, a tin/lead solder, and a lead-free solder alloy.

A thermal ground plane (TGP) is disclosed. The TGP may include a top layer; a mesh layer comprising a plurality of arteries formed along a length of the mesh layer; and a bottom layer comprising a plurality of pillars that extend into the plurality of arteries/. The bottom layer and the top layer may be sealed around at least one edge of the top layer and at least one edge of the bottom layer. Each of the plurality of pillars may have at least one dimension that is less than a dimension of at least one of the plurality of arteries.

In some embodiments, the plurality of arteries may be cut from the mesh layer. In some embodiments, the TGP may include a micro-wick layer disposed on the bottom layer. In some embodiments, the TGP may include a plurality of pillars disposed on the top layer.

BRIEF DESCRIPTION OF THE FIGURES

The patent or application file contains at least one drawing executed in color. Copies of this patent or patent application publication with color drawing(s) will be provided by the Office upon request and payment of the necessary fee.

These and other features, aspects, and advantages of the present disclosure are better understood when the following Detailed Description is read with reference to the accompanying drawings. The patent or application file contains at least one drawing executed in color. Copies of this patent or patent application publication with color drawing(s) will be provided by the Office upon request and payment of the necessary fee.

DETAILED DESCRIPTION

Figure 1:
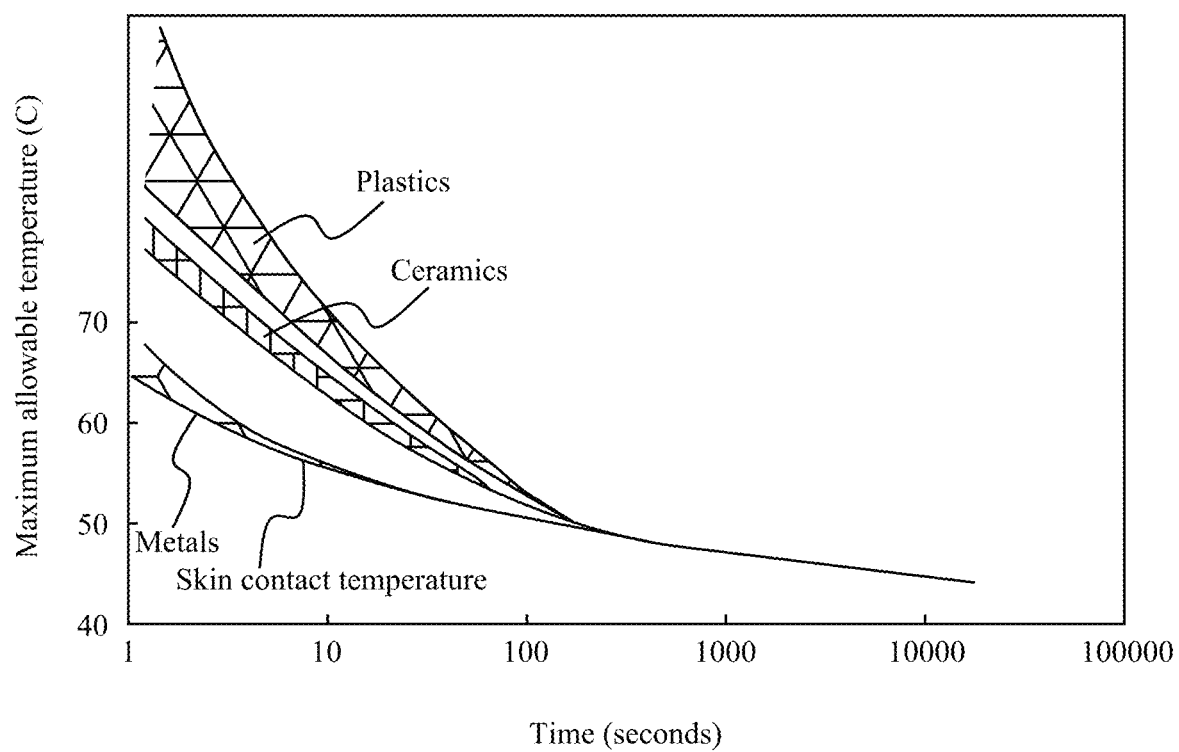
FIG. 1 is a graph illustrating the maxim um allowable surface temperatures of a mobile system using different materials with different contact duration.

One challenge for mobile systems, e.g., smartphones, tablets and wearable electronics, is the control of the skin temperatures. The skin temperature is the temperature of an exterior portion of a device (e.g., the case) that is touched by fingers, hands, face, ears, or any other part of a human body. When the temperature of a portion of a device reaches beyond the maxim um allowable temperature, a user would consider the temperature of the device to be hot. Of course, this perception of heat is dependent on the materials and the duration of the contact; it also varies from one person to another one due to their difference in thermal physiology. FIG. 1 illustrates a graph of acceptable skin temperatures for a number of different materials considering different touch duration.

Figure 2:
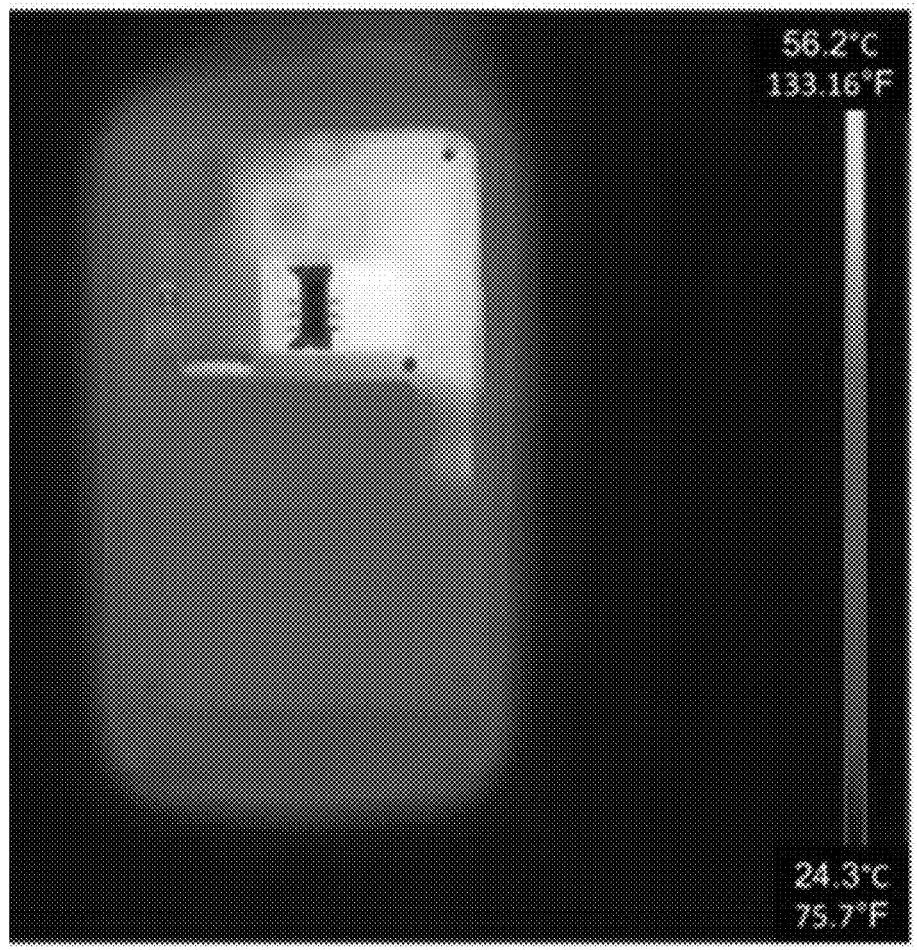
FIG. 2 is an example infrared image of illustrating a non-uniformly heated mobile device without effective heat spreading according to some embodiments.

As illustrated in FIG. 2, a hot spot or region with a much higher temperature than other locations on a smart phone (or other device) could be generated by an electronic chip such as, for example, a 5-Watt processor or a 1-Watt, small-size wireless amplifier. These hot spots or regions could be removed by effective heat spreading since the temperatures in the area outside these hot spots can be much lower.

Typically, a metal heat spreader, such as, for example, an aluminum or copper heat spreader, may be effective. However, the thickness of the metal heat spreader is being reduced in order to meet the demand for the reduction of the total system's thickness. For most mobile systems, a thinner configuration is usually desirable. With a thin metal heat spreader, its thermal resistance increases since it is affected by the thermal conductivity and cross-section area for heat conduction. Alternative approaches can use high thermal conductivity graphite heat spreaders. However, the thermal conductivity of graphite heat spreaders generally decreases with the thickness of the graphite layer. The high thermal conductivity graphite, e.g., thermal conductivity of 1,500 W/mK, is too thin, e.g., 0.017 mm, to be effective to transfer heat over a large area.

Some embodiments include a thin thermal ground plane (TGP) with improved thermal performance. For example, a TGP may use phase-change heat transfer mechanisms with an evaporation-vapor transport-condensation-liquid return path for heat transfer. As another example, a TGP may be a very good heat spreader with effective thermal conductivities higher than that of a copper (see FIG. 5). In some embodiments, a TGP may include components and/or may be manufactured with processes described in U.S. patent application Ser. No. 12/719,775, entitled "Flexible Thermal Ground Plane and Manufacturing the Same," which is incorporated herein in its entirety for all purposes.

Embodiments may also include a top layer including a plurality of spacers (or pillars) sealed with a bottom layer having a plurality of pillars. In some embodiments, the spacers may be deposited on the top layer using a lithographic patterning process. In some embodiments, the pillars may be deposited on the bottom layer using a lithographic patterning process. In some embodiments, the pillars and spacers may be bonded or scribed on the first and/or second planar substrate. In some embodiments, the pillars may have a diameter that is less than or greater than the diameter of the pillars and/or spacers. In some embodiments, the spacers pillars may have a spacing that is less than or greater than the spacing diameter of the pillars. In some embodiments, the pillars in the spacers may have a height, diameter or spacing that is less than or greater than the spacing of the pillars in the wicking structure.

Figure 3:
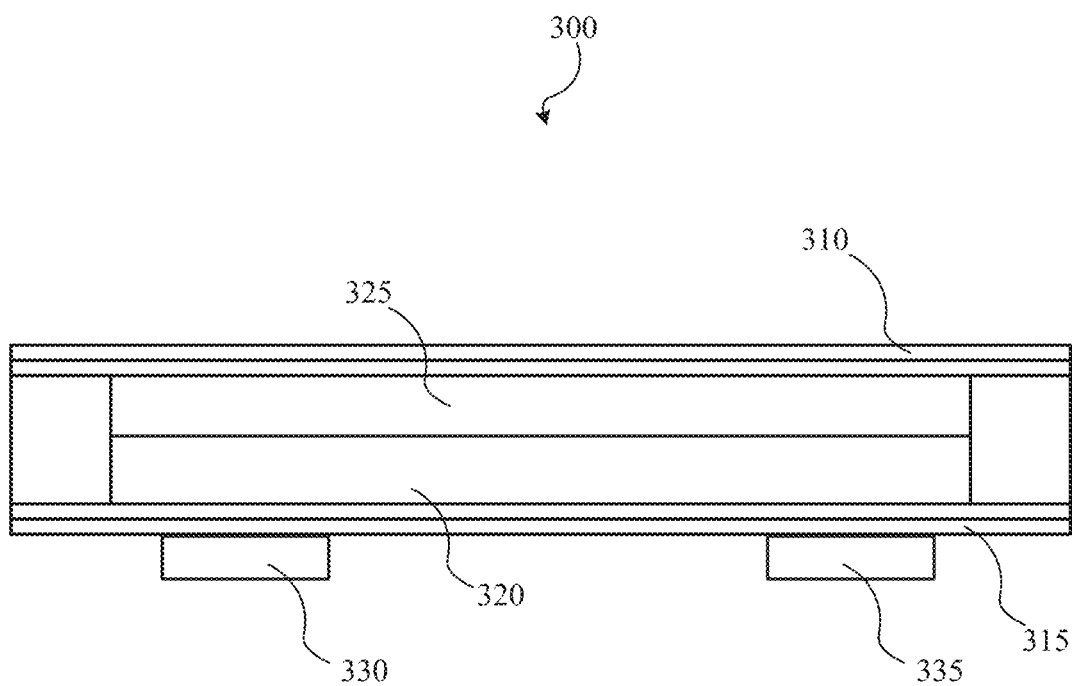
FIG. 3 illustrates an example diagram of a thermal ground plane (TGP) according to some embodiments.

FIG. 3 illustrates a diagram of an example TGP 300 according to some embodiments. In this example, the TGP 300 includes a top layer 310, a bottom layer 315, a liquid channel 320, and/or a vapor core 325. The TGP 300, for example, may operate with evaporation, vapor transport, condensation, and/or liquid return of water or other cooling media for heat transfer between the evaporation region 330 and the condensation region 335. The top layer 310 may include copper, polyimide, polymer-coated copper, copper-cladded Kapton, etc. The top bottom layer 315 may include copper, polyimide, polymer-coated copper, copper-cladded Kapton, etc. In some embodiments, the top layer 310 and the bottom layer 315 of the TGP may be sealed together using solder, laser welding, ultrasonic welding, electrostatic welding, or thermo-pressure compression or a sealant 340.

In some embodiments, the liquid channel 320 may include copper mesh, stainless-steel mesh, or meshes made of other materials but encapsulated with copper. The liquid channel 320, for example, may include one, two, three, four, five, six or more layers of mesh of the same or different materials. In some embodiments, the liquid channel 320 may be bonded and/or sealed using FEP (fluorinated ethylene propylene), electroplating, sintering, and/or other adhesives or sealants with the top layer 310. In some embodiments, in order to enhance hydrophilic properties of the metallic mesh, atomic layer deposition (ALD) of $Al_2O_3$, $TiO_2$, $SiO_2$, or other coatings may be used to encapsulate meshes of the liquid channel 320 with desirable functionality.

In some embodiments, the vapor core 325 may include a plurality of pillars and/or channels disposed on the top layer 310. The pillars and/or channels may be deposited using any type of deposition technique such as, for example, vapor deposition, etc.

Figure 4:
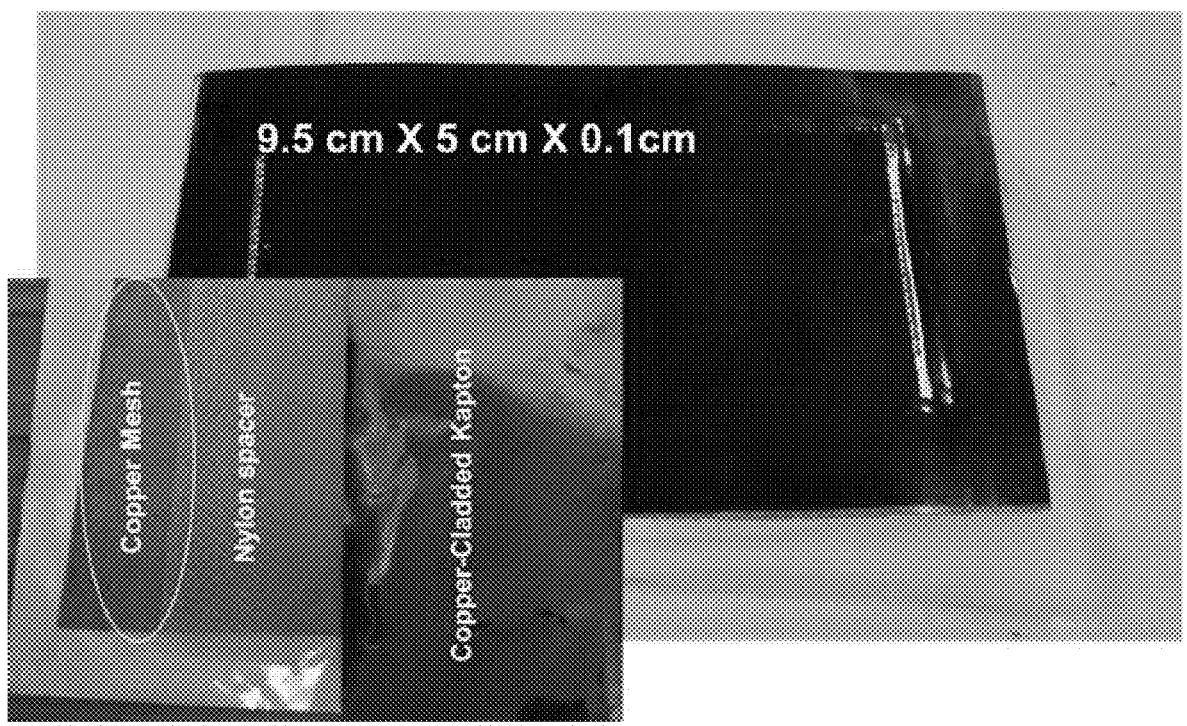
FIG. 4 illustrates examples of flexible thermal ground planes according to some embodiments.

FIG. 4 illustrates examples of flexible thermal ground planes according to some embodiments. The TGPs may include may an active region of various sizes, for example, the TGP may have at least one dimension (e.g., length, width, radius, diameter, etc.) that is less than 2 cm, 5 cm, 10 cm, 20 cm, 50 cm, 100 cm, 500 cm, 1000 cm, etc. and/or a thickness less than 0.1 mm, 0.25 mm, 0.5 mm, 1 mm, 10 mm 50 mm, 100 mm, etc. In a specific example, the active region may have dimensions of 9.5 cm×5 cm×0.1 cm.

In some embodiments, a TGP may include a copper-cladded Kapton bottom layer and a copper-cladded Kapton top layer with a copper or metallic mesh and/or a polymer spacer sandwiched in between. The metallic mesh may be copper mesh, stainless-steel mesh with or without a copper coating, or meshes made of other materials but encapsulated with copper. The copper mesh layer, for example, may include one, two, three, four, five, six or more layers of mesh. In some embodiments, portions of the TGP (e.g., the copper mesh and/or the polymer spacer) may be bonded and sealed using FEP (fluorinated ethylene propylene), electroplating, sintering, and/or other sealants. In some embodiments, in order to enhance hydrophilic properties of the metallic mesh, atomic layer deposition (ALD) of $Al_2O_3$, $TiO_2$, $SiO_2$, or other coatings may be used to encapsulate the meshes with desirable functionality.

Figure 5:
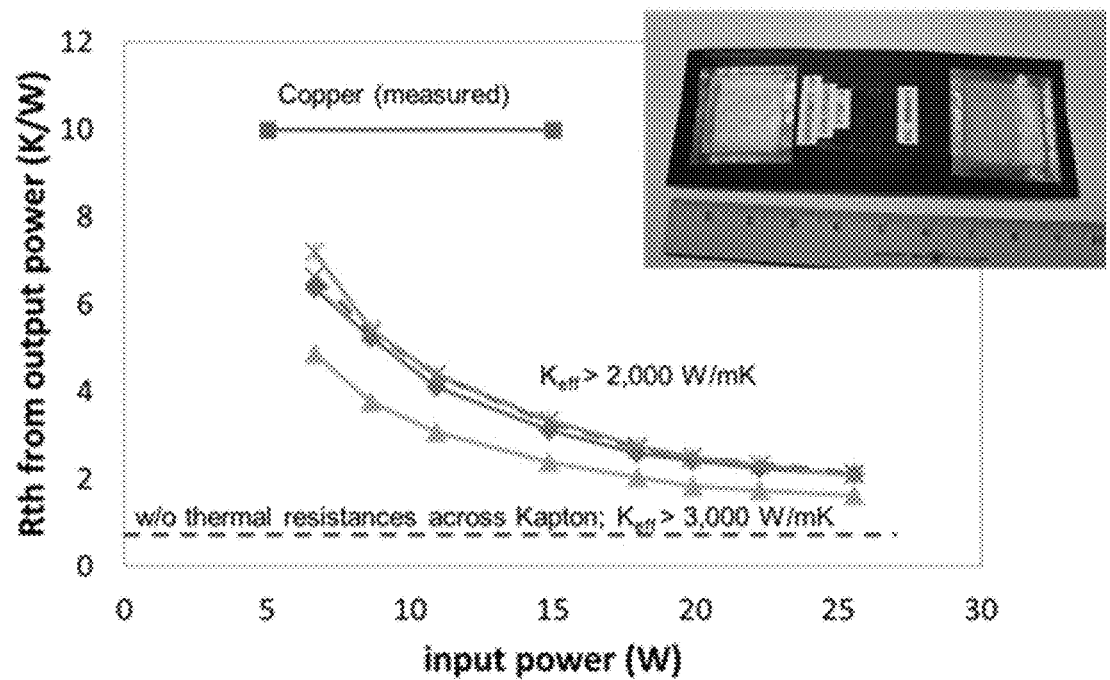
FIG. 5 illustrates the thermal resistance from an evaporation region to a condensation region of a TGP according to some embodiments calibrated with a 1 inch by 1 inch heater injecting heat to the TGP and 1 inch by 1 inch heat sink extracting heat from the TGP.

FIG. 5 illustrates the thermal resistance from the evaporator evaporation region to the condensation region of a TGP manufactured according to some embodiments. In this example, the TGP includes is characterized with a 1 inch by 1 inch heater injecting the heat to the TGP and a 1 inch by 1 inch heat sink extracting the heat from the TGP. In this example, the active region of the test sample is about 200 mm×50 mm×1 mm. The results are compared with those obtained for a copper reference sample with the same dimensions.

In some embodiments, the TGP may include a layer having a plurality of pillars manufactured with electroplating processes that produces, for example, large bonding pads with copper-nickel-gold layers. Additionally or alternatively, in some embodiments, an ALD hydrophilic or hydrophobic coating process may be used to change the wettability of the pillars.

As shown in FIG. 5, the thermal resistances of a TGP manufactured according to embodiments are compared with those of a copper reference sample with the same dimensions. The thermal resistance from the evaporator to the condenser is a function of input power of the heater. As shown in the graph, the thermal resistance drops from 7 K/W to about 2 K/W when the power increases from 5 to 25 Watts. The corresponding thermal resistance of the copper sample is about 10 K/W. The effective thermal conductivity of the TGP reaches about 2,000 W/mK at 25 Watts since its resistance is about ⅕ of the copper with the thermal conductivity of 400 W/mK. In another test, our customer ran the power all the way to 35 Watts and reached the effective thermal conductivities up to 4,000 to 7,000 W/mK.

In some embodiments, thermal vias with higher thermal conductivity than the substrate materials may be used. However, thermal vias were not used in this sample which was used to create generate the illustration results shown in the graph in FIG. 5; therefore, there is a relatively large and undesirable thermal resistance across the 50-um thick Kapton layer due to the low thermal conductivity of Kapton. With the use of thermal vias, the total thermal resistance of the TGP may increase with an effective thermal conductivity over 3,000 W/mK even at the 25-Watt power level.

Figure 6:
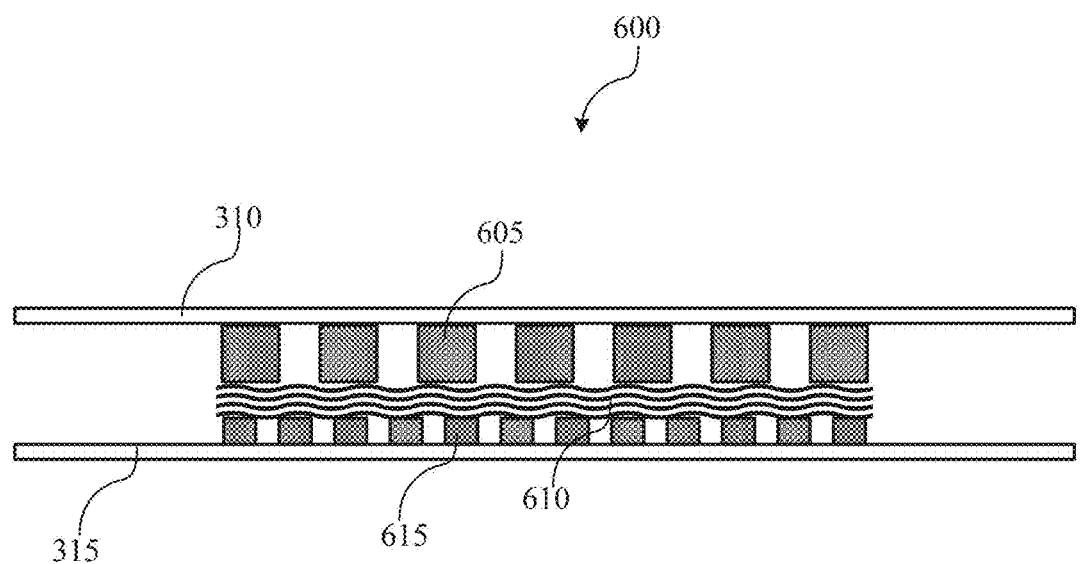
FIG. 6 illustrates a TGP according to some embodiments.

FIG. 6 illustrates a TGP 600 according to some embodiments. In this example, the top layer 310 and/or the bottom layer 315 may include copper cladded Kapton and/or may be similar to the top layer 310 and the bottom layer 315 described above in conjunction with FIG. 3. In some embodiments, the top layer 310 and the bottom layer 315 of the TGP 600 may be sealed together using solder, laser welding, ultrasonic welding, electrostatic welding, or thermo-pressure compression. In between the top layer 310 and the bottom layer 315 the TGP 600 may include a liquid channel, a wicking structure, and/or a vapor core.

The wicking structure 610, for example, may include a copper mesh, stainless-steel mesh with or without a copper coating, or one or more mesh made of other materials but encapsulated with copper. The wicking structure 610, for example, may include one, two, three, four, five, six or more layers of mesh of the same or different material. In some embodiments, the wicking structure 610 may be bonded and/or sealed using FEP (fluorinated ethylene propylene) electroplating, sintering, and/or other adhesives or sealants with the top layer 310. In some embodiments, in order to enhance hydrophilic properties of the wicking structure 610, atomic layer deposition (ALD) of $Al_2O_3$, $TiO_2$, $SiO_2$, or other coatings may be used to encapsulate meshes of the liquid channel 615 with desirable functionality. In some embodiments, the wicking structure 610 may be bonded with or on a plurality of pillars of the liquid channel 615.

In some embodiments, the wicking structure 610 may include a woven mesh that may be bonded to the pillars of the liquid channel 615 and/or the vapor core 605 through an electroplating process. In some embodiments, the mesh may be a copper woven mesh or a metallic mesh. During this process, for example, the wicking structure 610 (e.g., woven mesh) may be encapsulated by copper. The top layer 310 with the vapor core 605 and the bottom layer 315 with the liquid channel 615 may be sealed together with the wicking structure 610 with a mesh in between. After sealing, the TGP 600 may be charged with a working fluid, such as water, methane, ammonia, or other coolants or refrigerants that are compatible with the surfaces exposed to the working fluid.

The liquid channel 615, for example, may include a plurality of pillars (e.g., electroplated pillars).

The vapor core 605, for example, may include a plurality of pillars (e.g., electroplated pillars). In some embodiments, the pillars in the vapor core 605 may have at least one dimension (e.g., height, width, length, diameter, etc.) that is smaller than at least one dimension (e.g., height, width, length, diameter, etc.) of the pillars of the liquid channel 615.

In some embodiments, a photo-lithographic patterning process may be used to fabricate the pillars in the liquid channel 615 and/or the vapor core 605. For example, a photo-lithography process may be used to form a plurality of pillars on the top layer 310 to form the vapor core 605 and/or a photo-lithographic patterning process may be used to form a plurality of pillars on the bottom layer 315 to form the liquid channel 615. The photo-lithographic patterning process, for example, may control the positioning and/or the heights of the pillars with a resolution of a few microns. The plurality of pillars on the top layer 310 and/or on the bottom layer 315 may be formed by the mechanical scribing process.

In some embodiments, the thickness of a TGP (e.g., TGP 300 or TGP 600, or any other TGP described in this disclosure) may be a few millimeters or even less than about 500, 450, 400, 350, 300, 250, 200, 150, or 100 microns. For example, the top layer 310 and/or the liquid channel 615) may be 5, 10, 20, 30, 40, 50, 60, etc. microns thick, the wicking structure (e.g., wicking structure 610) may be 5, 10, 20, 30, 40, 50, 60, etc. microns thick, and/or the vapor core (e.g., vapor core 605) may be 10, 20, 30, 40, 50, 75, 100, 125, 150, etc. microns thick.

Figure 7:
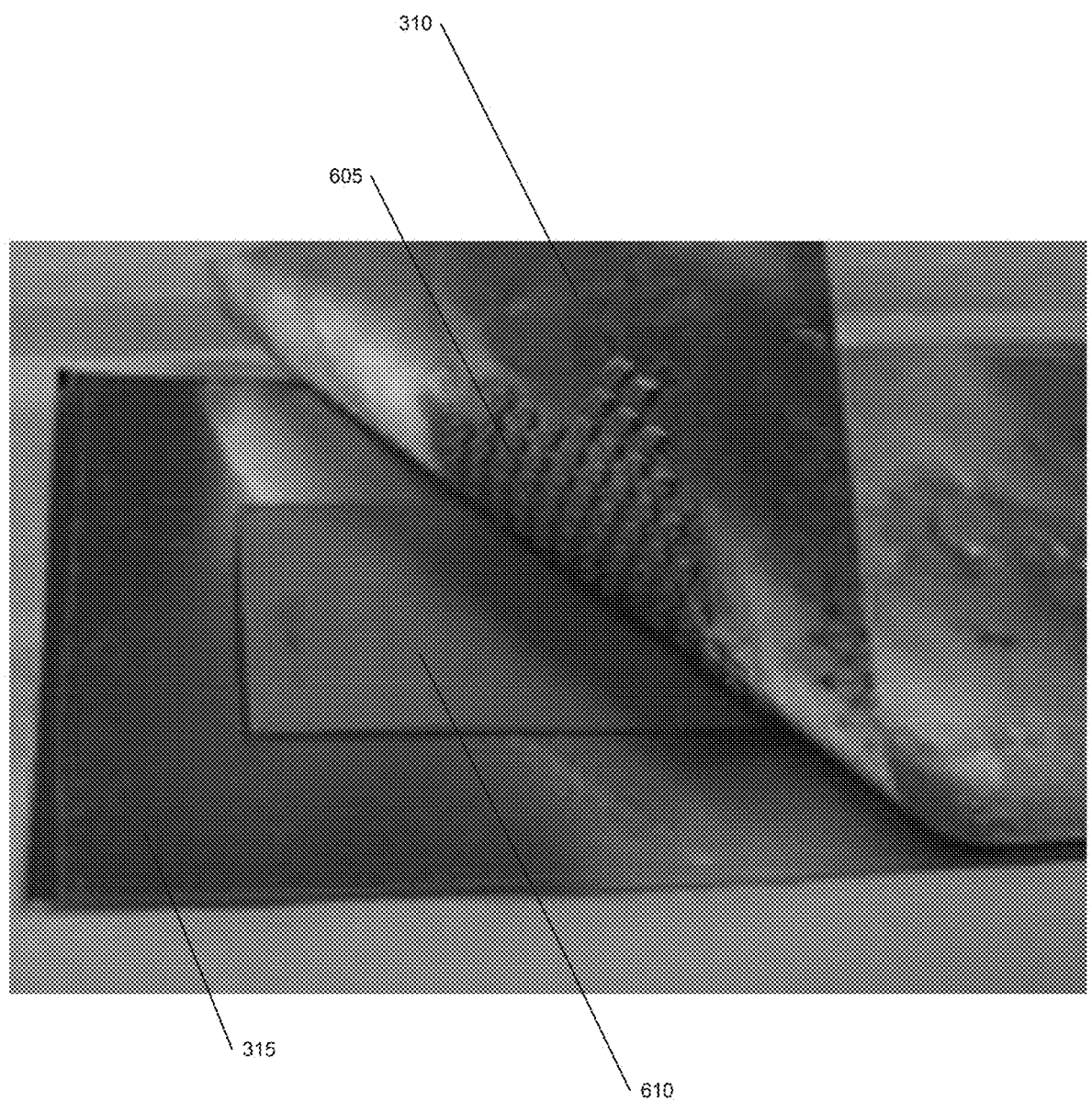
FIG. 7 shows a TGP with a top layer having pillars formed therein, a bottom layer having pillars formed therein, and a wicking structure according to some embodiments.

FIG. 7 shows an example of a TGP 600 with a top layer 310 having pillars formed thereon to form the vapor core 605, a bottom layer 315 having pillars formed thereon to form the liquid channel 615 and a wicking structure 610 disposed in between according to some embodiments.

Figure 8:
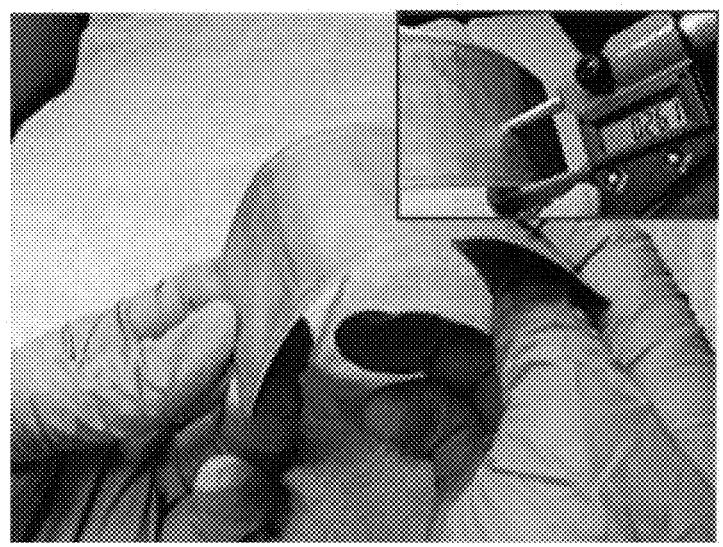
FIG. 8 illustrates the thinness of TGPs manufactured according to some embodiments.
Figure 8:

In some embodiments, the pillars may be fabricated using electroplating over photo-lithograpy-defined openings. In some embodiments, TGPs manufactured according to some embodiments may have a thickness larger than or less than 0.25 mm as shown in FIG. 8. The total thickness can be reduced further since all dimensions of critical features are defined by the photo-lithography processes. In some embodiments, TGPs may have a thickness less than about 0.25, 0.2, 0.15, 0.1, 0.05 mm, etc.

In some embodiments, the pillars of the liquid channel 615 and/or the vapor core 605 may allow the TGP to remain effective under different mechanical loadings even in an extremely thin configuration.

Figure 9:
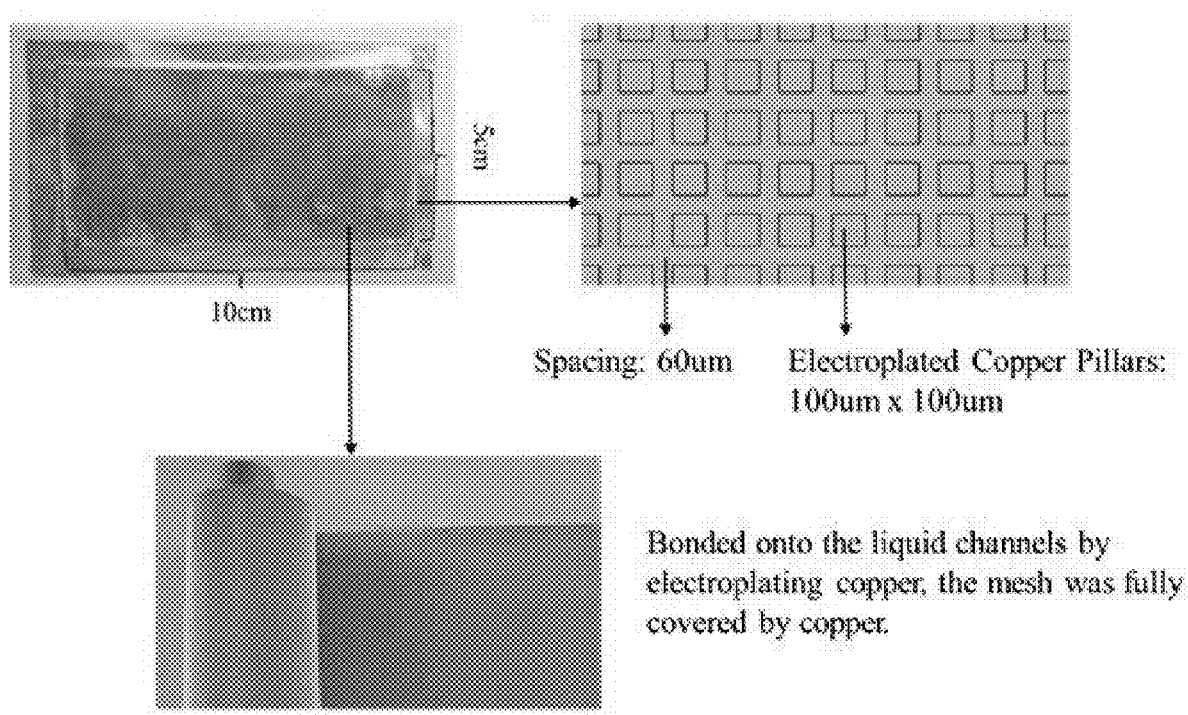
FIG. 9 illustrates an example TGP having a bottom layer with copper pillars electroplated and bonded with a copper-coated stainless steel mesh according to some embodiments.

FIG. 9 illustrates an example TGP with a plurality of electroplated pillars and mesh according to some embodiments. For example, the pillars on the top layer and/or the bottom layer may be fabricated using a photo-lithographic patterning process and/or may have any dimension such as, for example, 100 um×100 um squares with 60 um spacing in between each square. These pillars, for example, may be bonded to a stainless steel woven mesh (e.g., having 500 wires/inch, 50 μm thick) through various bonding techniques such as, for example, copper electroplating. The mesh, for example, may also be at least partially or completely encapsulated by electroplated copper.

In some embodiments, the combined mesh-pillar structure may achieve low capillary radius (or high pumping pressure) in the evaporation regions and higher flow hydraulic radius (or low flow pressure drop) in the fluid channel.

In some embodiments, a controlled over-plating process may be used to form the pillars with rounded heads. In some embodiments, this shape may be beneficial, for example, to form a sharp angle of each interface between a pillar and the mesh bonded. These sharp angles, for example, may enhance the capillary p umping force pulling the liquid returned from the condenser to the evaporator.

Figure 10:
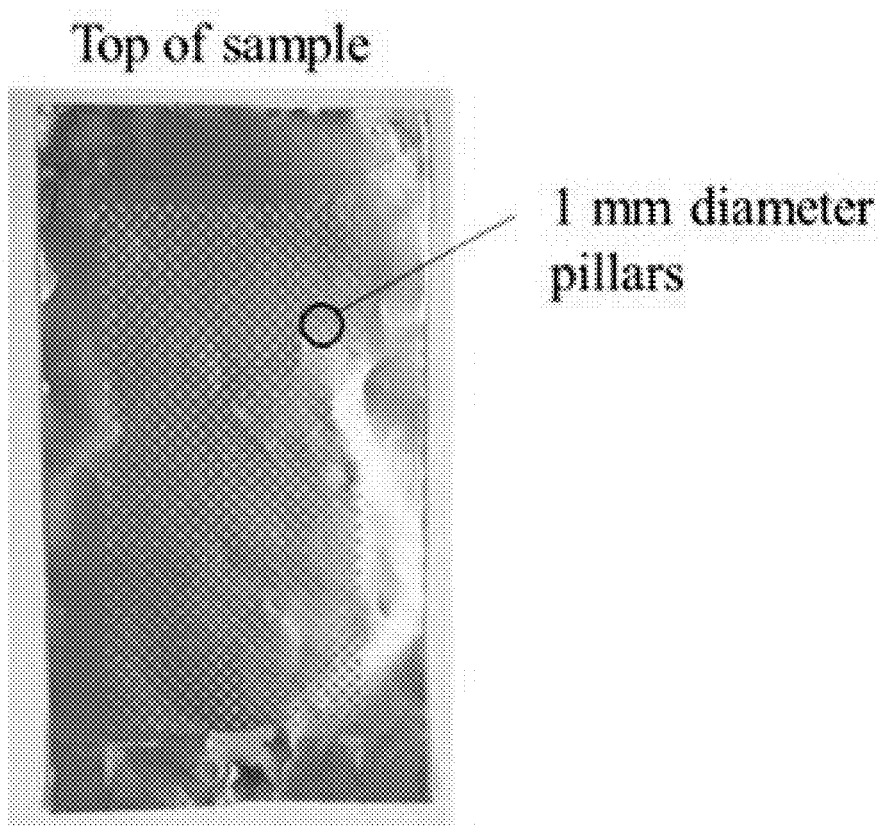
FIG. 10 shows a top layer with a plurality of copper pillars according to some embodiments.

FIG. 10 shows an example top layer with copper pillars electroplated through a photolithography-defined opening according to some embodiments. In this example, the height of the pillars is 100 microns, the diameter (or width) of the pillars is 1 mm, and the spacing between the pillars is 2 mm. In this example, the pillars may define the gap of the vapor core. With large spacing (e.g., a spacing between pillars that is greater than the diameter of the individual pillars or a spacing between pillars that is greater than or equal to twice the diameter of the individual pillars) the flow resistance may be reasonably low.

In some embodiments, the pillars formed on the top layer and/or on the bottom layer may be hydrophilic. In some embodiments, the pillars may have a cross section that is round; oval; polygonal; star shaped as shown, for example, in FIG. 6; hexagonal; octagonal; pentagonal; square; rectangular; triangular; etc. In some embodiments, condensation of vapor can occur along the vapor core. In some embodiments, the hydrophilic property of the pillars in the vapor core can reduce the size of vapor droplets or bubbles. In some embodiments, the star-shaped pillars can further enhance the hydrophilic properties or wettability.

In some embodiments, the pillars may be constructed from material other than copper. The pillars, for example, may be manufactured from polymer using photo-lithographic deposition and etching techniques. Such polymer pillars, for example, can be baked, followed by hermetic encapsulation with copper, ALD moisture barrier coating or other sealing materials. In some embodiments, the thermal conductivities of polymer pillars may be much lower than that of copper.

In some embodiments, the process of manufacturing a TGP may include a removing air out of the TGP followed by charging the TGP with water or other working fluid that is compatible with an exposed TGP inner surface. In some embodiments, a small diameter copper tube may be coupled with the TGP to allow for vacuuming and/or charging. After water charging, for example, this tube can be pinch-sealed. In some embodiments, the pinch-sealed tube can be removed by an additional seal separating the active region from the region with the tube.

Figure 11:
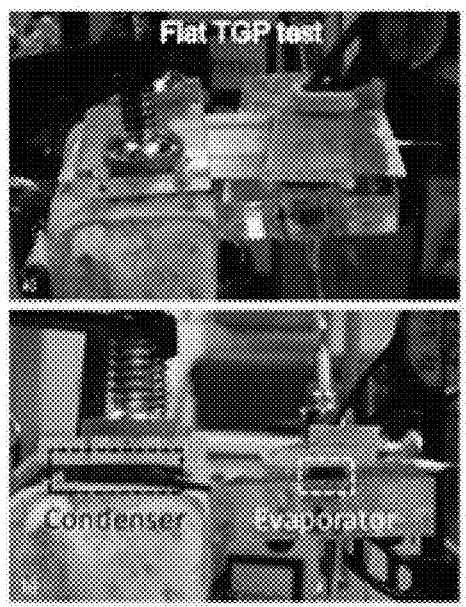
FIG. 11 shows an experimental setup that can be used to characterize the properties of a thin flexible TGP with a condensation region defined by a cold plate according to some embodiments.
Figure 11:
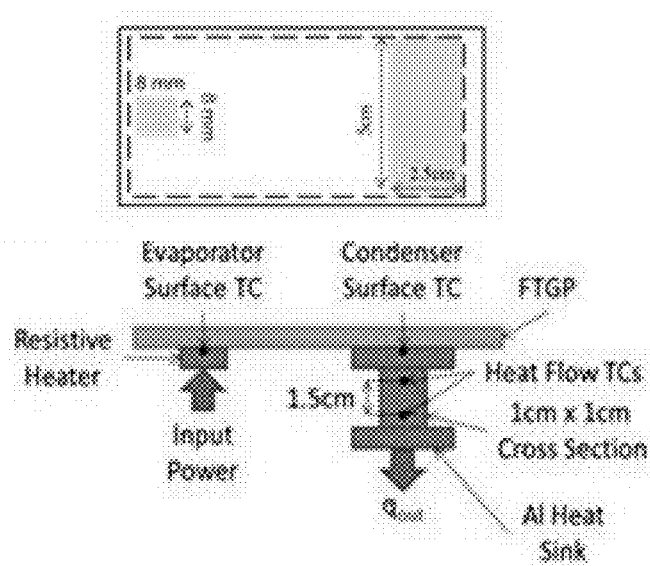

FIG. 11 shows an experimental setup that can be used to characterize the properties of a thin flexible TGP according to some embodiments. In this example, the evaporator (e.g., heater) region was defined by the heater size was of 8 mm×8 mm and the condensation region was defined by the condenser block was with an area of 5 cm×2.5 cm. The temperature difference between the evaporator evaporation region and the condenser condensation region was measured, and this difference per unit of heat transferred to the condenser heater's input power was used to calculate considered the thermal resistance. The entire setup was covered by thermal insulation to reduce air natural convection effect by air.

Figure 12:
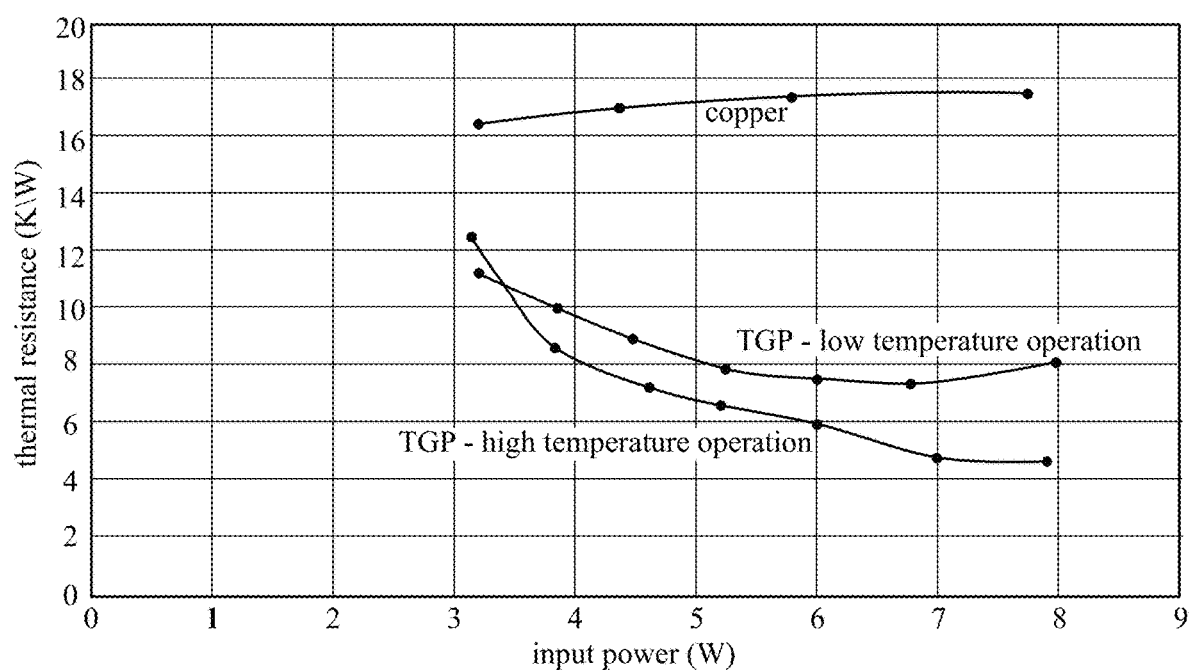
FIG. 12 is a graph showing the thermal resistances of a TGP manufactured according to some embodiments and using the experimental setups shown in FIG. 11.

FIG. 12 is a graph showing the thermal resistances as a function of heater's input power of a TGP manufactured according to some embodiments and using the experimental setups shown in FIG. 11. As shown in the figures, TGPs manufactures manufactured according to embodiments outperform copper. From these results, the thin TGP's, effective thermal conductivity may be between 500 and 5,000 W/mK or 1,000 and 1,500 W/mK.

Figure 13:
FIG. 13 shows an experimental setup that can be used to characterize the properties of a thin flexible TGP with distributed condensers condensation where the heat is extracted by nature air convection according to some embodiments.

In some embodiments, the location of heat extraction condensation may affect a TGP's performance. FIG. 13 shows an experimental setup that can be used to characterize the properties of a thin flexible TGP with distributed condensers condensation cooled by air nature air convection without an active cooling heat sink according to some embodiments. In the Figure, a 1 inch×1 inch heater placed at the center of each sample's bottom side with wicking layer attached, the temperature difference between an upper region and the center (the heated region) on the top side with spacer layer attached was about 0.6° C. for the TGP sample with 4 W input. This temperature difference was increased to 5.4° C. for the copper sample with the same 4 W input. With distributed condensation over a large area, comparing to copper, the heat spreading performance of the TGP's was improved significantly, even without an active heat sink.

Figure 14A:
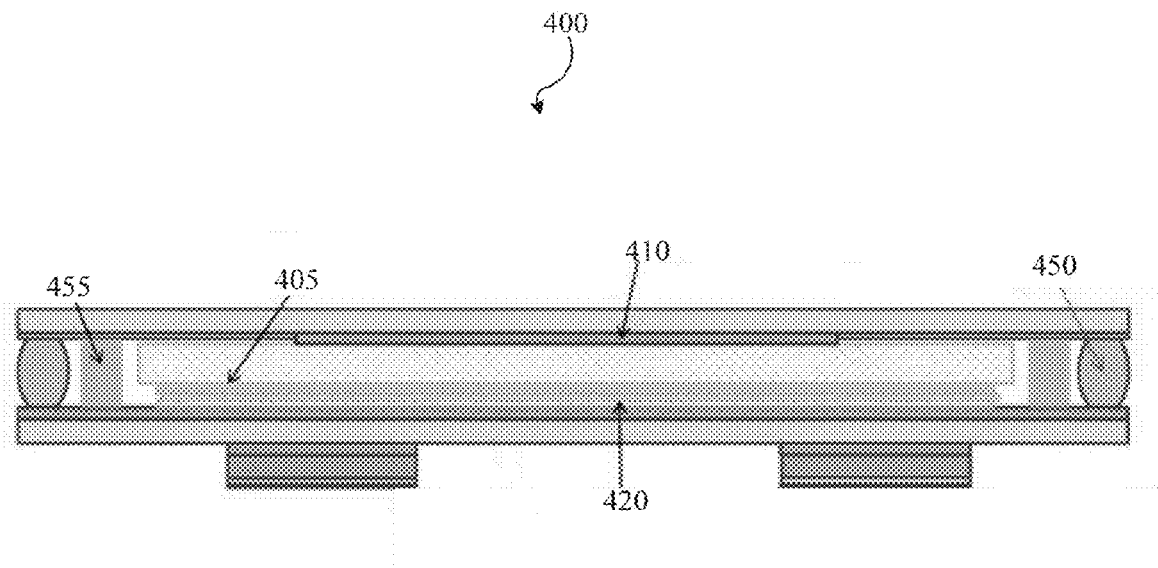
FIG. 14A illustrates another example TGP according to some embodiments.

FIG. 14A illustrates a TGP 400 according to some embodiments. TGP 400 may be constructed with any of the following configurations. For example, the material on the interior surface exposed to water may be copper. As another example, a stainless steel mesh 405 may be used that is encapsulated by copper. As another example, a copper mesh can be used. As another example, the spacer 420 for the vapor core may be defined by a polymer mesh such as, for example, a nylon mesh or a PEEK mesh in conjunction with or in addition to copper pillars. In addition the spacer 420 may be a copper mesh. In some embodiments, one or more copper cladded Kapton layers 410 and 420 may be included. In some embodiments, a wicking layer 405 may be included. One or more layers may be combined and/or bonded together.

Figure 14B:
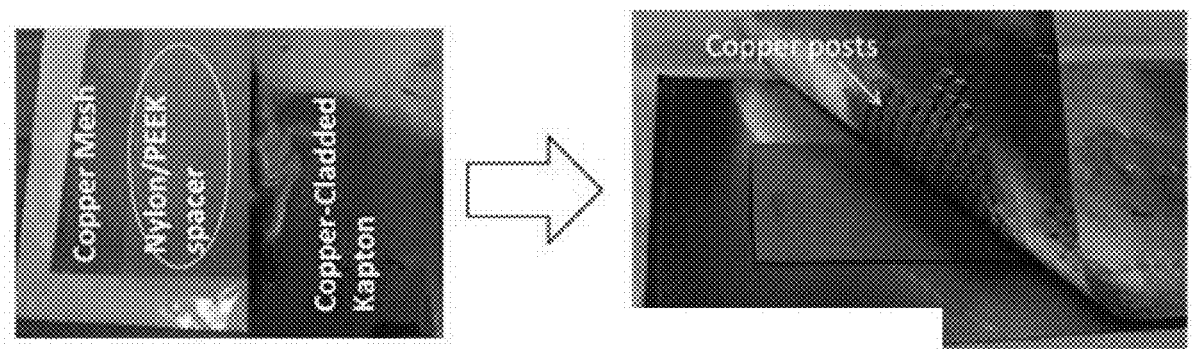
FIG. 14B shows a TGP according to some embodiments.

FIG. 14B shows an example TGP according to some embodiments. In this example, a plurality of meshes (e.g., a copper mesh and a nylon/peek spacer) may be sealed between copper cladded Kapton layers.

The bottom layer and/or the top layer may be assembled and/or sealed with one or more sealing techniques such as, for example, ultrasound welding, laser welding, pressure thermo-compression between two layers and/or with a solder seal to form a high-yield hermetic seal. Any other technique may be used to hermetically seal the TGP such as, for example, photolithography-defined solder masking, copper-to-copper seam welding including ultrasonic welding or laser welding, copper-silver sintering, solder dipping, etc. In this example, a first seal 455 and a second seal 455 may be used.

Figure 15:
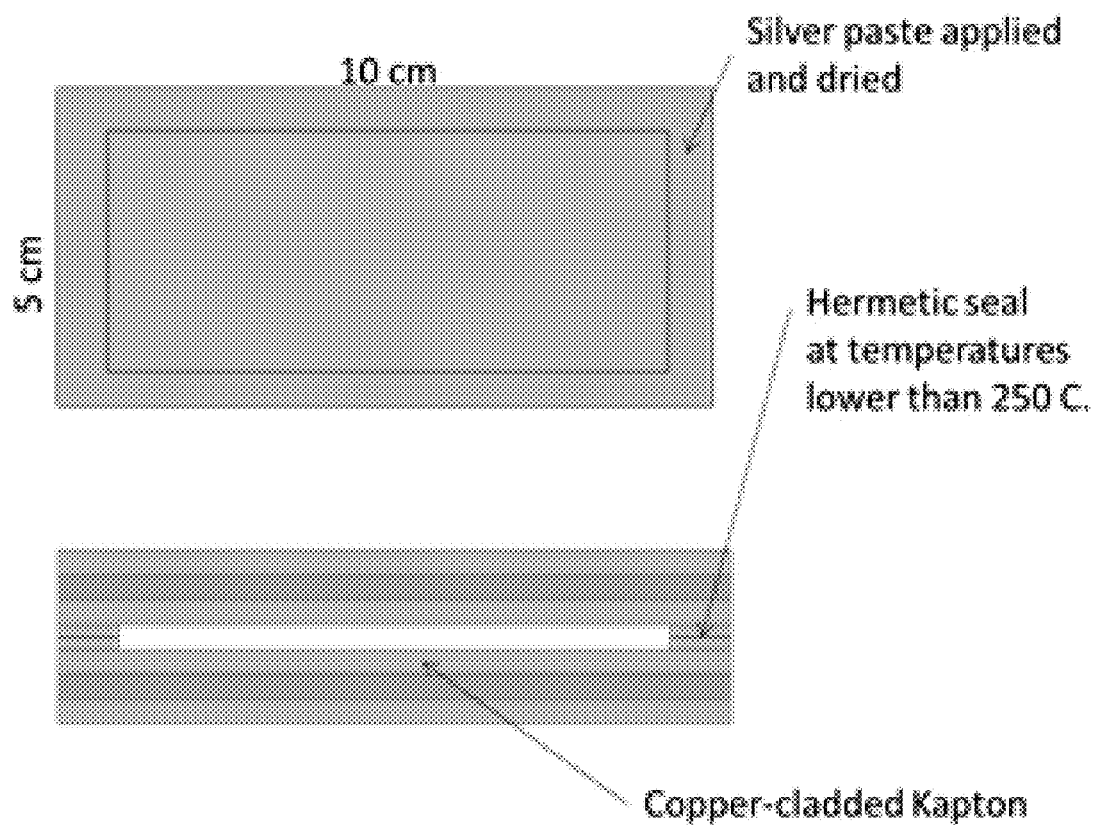
FIG. 15 illustrates another example TGP according to some embodiments.

FIG. 15 illustrates another example TGP according to some embodiments. In this example, a bottom layer of copper cladded Kapton and a top layer of copper cladded Kapton can be bonded by copper silver sintering using a silver paste. The silver paste, in some embodiments, may allow for lower temperature soldering or sintering. For example, silver paste may be used for bonding at 250° C. without any pressure applied. In some embodiments, the copper surface may be treated with gold, silver and/or palladium. In some embodiments, the organic binder in the paste may be removed by a drying process before sintering.

Figure 16:
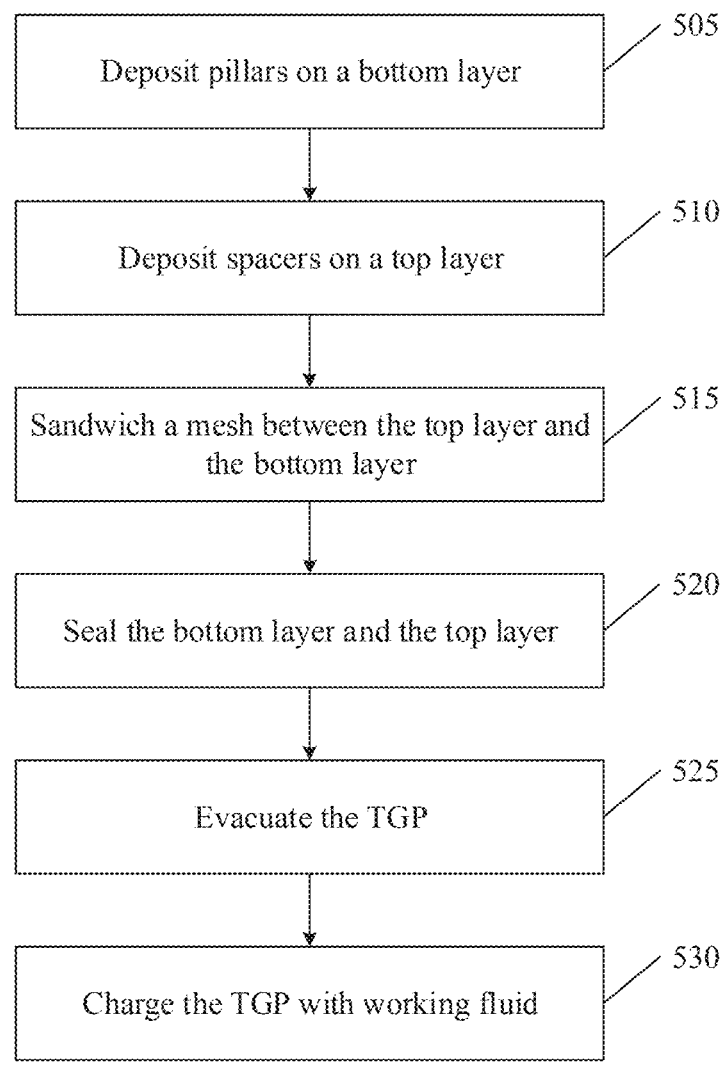
FIG. 16 illustrates an example process for fabricating a TGP according to some embodiments.

FIG. 16 illustrates an example process for fabricating a TGP according to some embodiments. At block 505, a plurality of pillars may be formed on a bottom layer. These pillars, for example, may be used to form a liquid layer or channels. The pillars may be formed using any type of lithographic patterning process or mechanical scribing process. The pillars may have a height less than a millimeter, a diameter of less than 5 millimeters, and a spacing between pillars that is greater than the diameter of the individual pillars. The pillars may be metal and/or polymers based, and/or include a hydrophilic coating or a hydrophobic coating.

At block 510, a plurality of spacers may be formed on a top layer. These spacers, for example, may be used to form a vapor core layer. The spacers may be formed using any type of lithographic patterning process. The spacers may have a height less than a millimeter, a diameter of less than 5 millimeters, and a spacing between pillars that is greater than the diameter of the individual pillars. In some embodiments, the spacers may have a diameter of less than the diameter of the pillars and/or a space between pillars that is greater than the diameter of the individual pillars. The spacers may be metal and/or polymer based and/or encapsulated by copper and/or include a hydrophilic coating and/or include a hydrophobic coating.

At block 515, a mesh layer may be sandwiched between the top layer and the bottom layer. The mesh may be a metal mesh, a metal-encapsulated mesh, or a copper-encapsulated stainless steel mesh. The mesh may be a woven mesh. The woven mesh, for example, may have a weave that is less than 75 microns in thickness. In some embodiments, the mesh may be copper encapsulated. In some embodiments, the mesh may have a desirable wettability with hydrophilic or hydrophobic coatings. In some embodiments, the reaction of the mesh with water may be negligible. In some embodiments, the mesh can be bonded to the bottom layer by electroplated copper.

At block 520 the top layer and the bottom layer may be sealed to create a void cavity within which a working fluid may be placed. Any type of sealing may be used including those described herein and those not described herein. A tube may extend through the sealing to allow evacuation and charging of the TGP.

At block 525 any air or non-condensable gas or other material within the void may be evacuated using any technique. At block 530 the TGP may be charged with a working fluid such as, for example, water, methane, ammonia, or other working fluid that is compatible with the exposed TGP inner surface.

The various steps in the process shown in FIG. 16 may occur in any order and/or any block may be removed.

In some embodiments, a TGP may be sealed with tin/lead solder (or similar lead-free solder alloys) according to some embodiments. Tin/lead solder's reaction with water may be limited.

Figure 17:
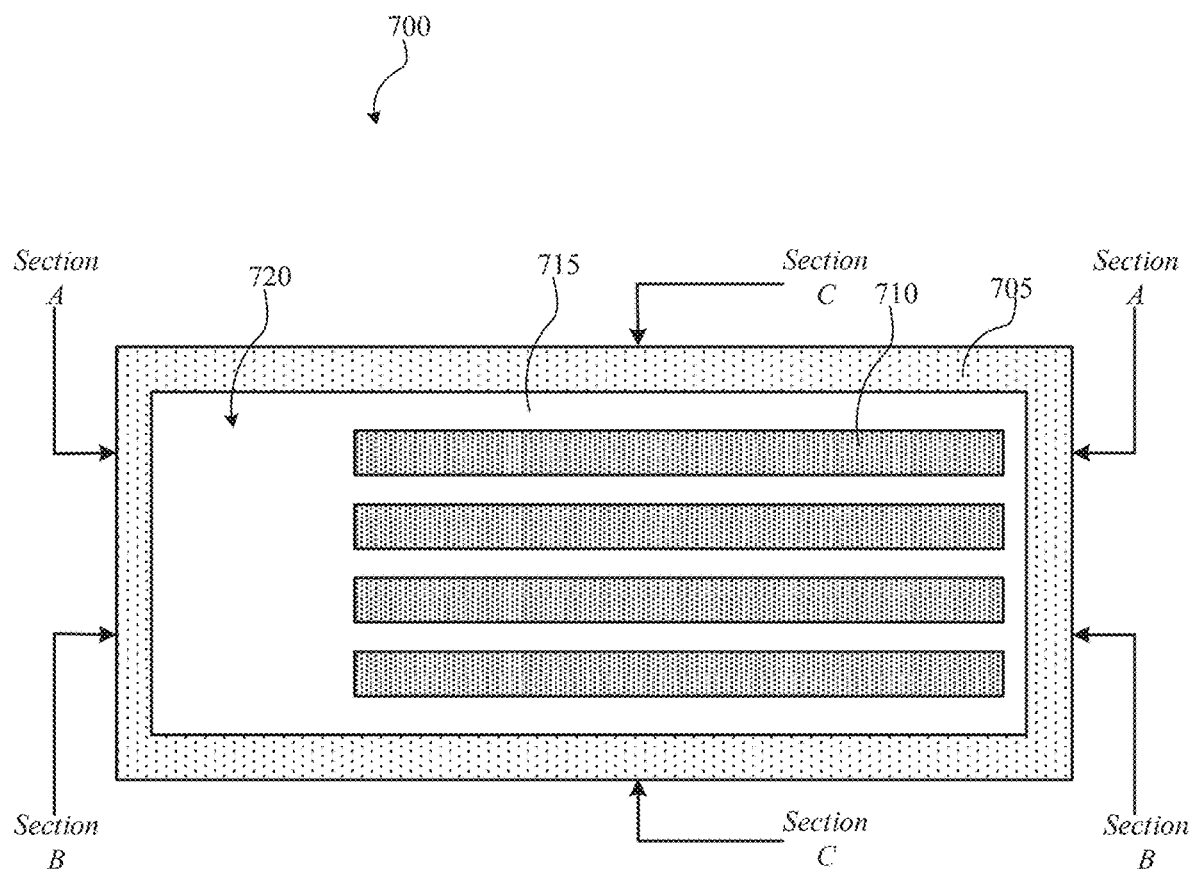
FIG. 17 illustrates a top view of another TGP 700 according to some embodiments.
Figure 18A:
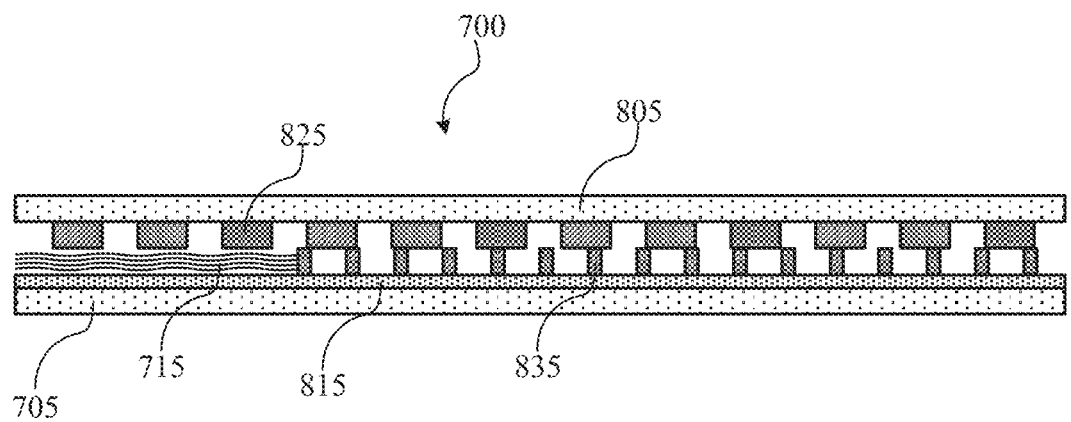
FIGS. 18A, 18B, and 18C illustrate side views of the TGP shown in FIG. 17 according to some embodiments.
Figure 18B:
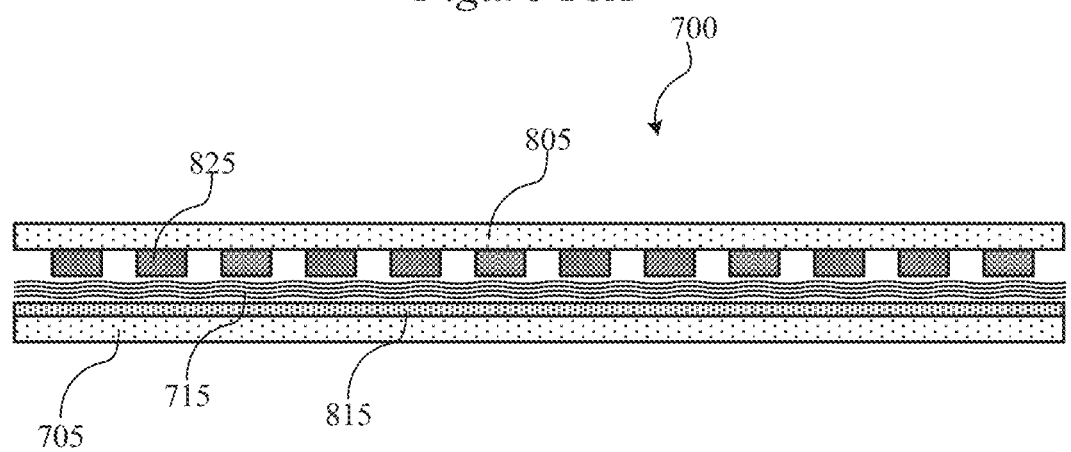
Figure 18C:
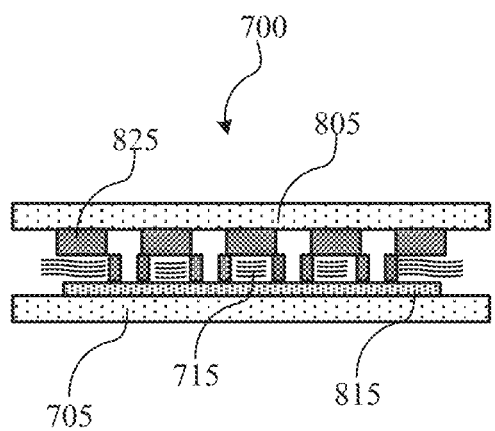

FIG. 17 illustrates a top view of another TGP 700 and FIGS. 18A, 18B, and 18C illustrate side views of the TGP 700 according to some embodiments. The TGP 700 includes a top layer (805 in FIG. 18) and a bottom layer 705. FIG. 17 shows the TGP 700 with the top layer 805 removed. The top layer 805 and/or the bottom layer 705 may include copper and/or polyimide material. In some embodiments, the top layer 805 and/or the bottom layer 705 may include layers of both copper and polyimide.

The TGP 700 includes a mesh return layer 715 that includes a plurality of return arteries 710 formed or cut within the mesh return layer 715. In some embodiments, the return arteries 710 may not extend into the evaporator region 720 of the TGP 700. In some embodiments, the width of the return arteries 710 may be less than 30 microns. In some embodiments, the width of the return arteries 710 may be less than 100 microns. In some embodiments, the mesh return layer 715 may include a wick. In some embodiments, the mesh return layer 715 may include a steel mesh such as, for example, a mesh with wires that are less than 50 microns or 25 microns thick. In some embodiments, the mesh return layer 715 may include a mesh with a simple weave at 200, 300, 400, 500, 600, 700, etc. wires/inch. In some embodiments, the mesh return layer 715 may be electroplated with copper. The mesh return layer 715 may include a specified evaporator region that may provide a specific location for a heat source. In some embodiments, the mesh return layer 715 may have a thickness of about 40 microns.

The mesh return layer 715 may have any number of shapes and/or configurations. In some embodiments, the mesh return layer 715 may have a polygonal or circular shape. In some embodiments, the mesh return layer 715 may have multiple sections without return arteries 710. In some embodiments, the mesh return layer 715 may include any number, shape or configuration of return arteries 710. In some embodiments, the return arteries 710 may have one or more pillars or other mechanisms disposed within the return arteries 710.

In some embodiments, return pillars 835 (see FIG. 18) may extend from the bottom layer 705 through the return arteries 710 of the mesh return layer 715. In some embodiments, the return pillars 835 may form vapor regions running parallel to the mesh return layer 715. In some embodiments, the return pillars 835 may form arteries in the adiabatic and/or condenser regions of the TGP 700.

The return pillars 835 may have at least one dimension that is smaller than the width of the return arteries 710. In some embodiments, these pillars may have at least one dimension (e.g., height, width, length, diameter, etc.) that is less than 10 microns. In some embodiments, these pillars may have at least one dimension (e.g., height, width, length, diameter, etc.) that is less than 50 microns. In some embodiments, these pillars may have at least one dimension (e.g., height, width, length, diameter, etc.) that is less 100 microns.

FIG. 18A shows a side view of TGP 700 cut through Section A shown in FIG. 17. In FIG. 18A, the TGP 700 is cut through a region where a return arteries 710 extends along a portion of the mesh return layer 715. As shown in FIG. 18A, the mesh return layer 715 is present in the evaporator region. The return pillars 835 are shown extending through the return arteries 710. The TGP 700 also includes a plurality of top pillars 825 disposed on the top layer 805. The top pillars 825 may have at least one dimension (e.g., height, width, length, diameter, etc.) that is larger than the return pillars 835. The top pillars 825 may have at least one dimension (e.g., height, width, length, diameter, etc.) that is larger than 0.25 mm, 0.5 mm, 0.75 mm, 1.0 mm, 1.25 mm, etc.

In some embodiments, the TGP 700 may include a micro wick layer 815. The micro wick layer 815, for example, may include a plurality of pillars (e.g., electroplated pillars). The micro wick layer 815 may have at least one dimension (e.g., pillar height, width, length, diameter, pitch, etc.) that is smaller than the return pillars 835. The micro wick layer 815 may have at least one dimension (e.g., height, width, length, diameter, etc.) that is smaller than 5 μm, 10 μm, 15 μm, 20 μm, 25 μm, etc. The micro wick layer 815 may be aligned with the return arteries 710.

FIG. 18B shows a side view of TGP 700 cut through Section B shown in FIG. 17. In FIG. 18B, the TGP is cut through a region without the return arteries 710 extending along a portion of the mesh return layer 715. Instead, the mesh return layer 715 extends along the length of the TGP 700 along this section of the TGP 700.

FIG. 18C shows an end view of TGP 700 cut through Section C shown in FIG. 17. In FIG. 18C, the TGP is cut through the mesh return layer 715 showing both the mesh return layer 715 and the return arteries 710 formed in the mesh return layer 715. In some embodiments, the return pillars 835 may extend through the return arteries 710. In some embodiments, one or more of the return pillars 835 may contact one or more of the top pillars 825.

In some embodiments, the top layer 805 and the bottom layer 705 are sealed along at least one edge of the top layer 805 and along at least one edge of the bottom layer 705. In some embodiments, the top layer 805 and the bottom layer 705 are sealed along at least two edges of the top layer 805 and along at least two edges of the bottom layer 705.

Figure 19:
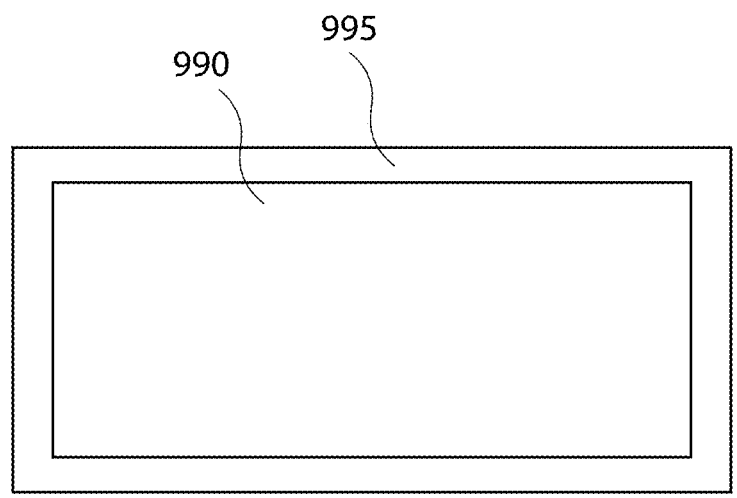
FIG. 19 illustrates a block diagram of a wicking structures according to some embodiments.

In some embodiments, as shown in FIG. 19, the plurality of wicking structures 990 comprise a mesh layer. The mesh layer, for example, may include a mesh selected from the list consisting of copper mesh, stainless steel mesh, metal mesh, polymer mesh and copper-encapsulated mesh. The mesh layer, for example, may include a hydrophilic coating 995 or a hydrophobic coating or hermetic coating.

Figure 20:
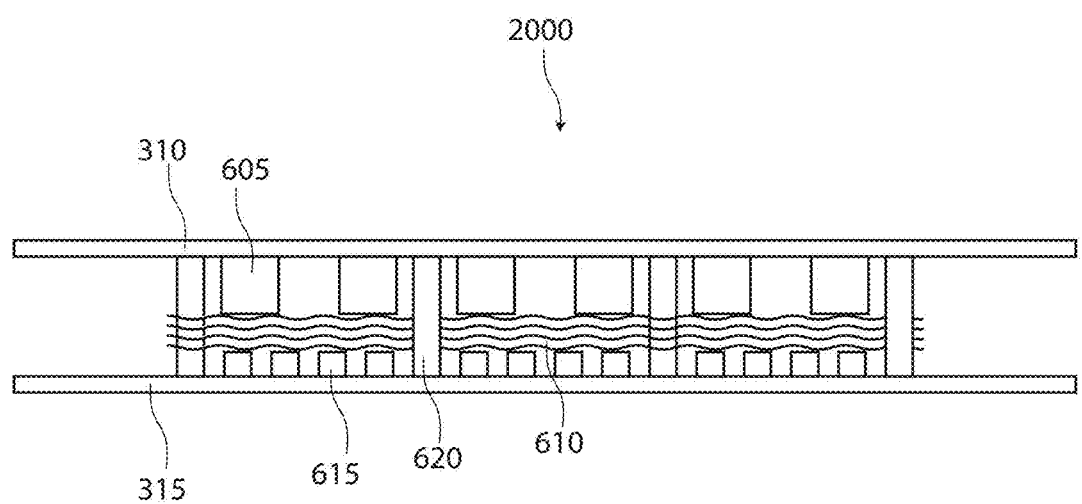
FIG. 20 illustrates a TGP according to some embodiments.

FIG. 20 illustrates a TGP 2000 according to some embodiments. In this example, the top layer 310 and/or the bottom layer 315 may include copper cladded Kapton and/or may be similar to the top layer 310 and the bottom layer 315 described above in conjunction with FIG. 3. In some embodiments, the top layer 310 and the bottom layer 315 of the TGP 2000 may be sealed together using solder, laser welding, ultrasonic welding, electrostatic welding, or thermo-pressure compression. In between the top layer 310 and the bottom layer 315 the TGP 600 may include a liquid channel, a wicking structure, and/or a vapor core.

In some embodiments, the top layer 310 and/or the bottom layer 315 may comprise copper and stainless steel, copper and a polymer, copper, copper cladded Kapton, polymer, etc. In some embodiments, the top layer 310 and the bottom layer 315 may include the same material or different material.

The mesh 610, for example, may include a copper mesh, stainless-steel mesh with or without a copper coating, or one or more mesh made of other materials but encapsulated with copper. The, for example, may include one, two, three, four, five, six or more layers of mesh of the same or different material. In some embodiments, the may be bonded and/or sealed using FEP (fluorinated ethylene propylene) electroplating, sintering, and/or other adhesives or sealants with the top layer 310. In some embodiments, in order to enhance hydrophilic properties of the, atomic layer deposition (ALD) of $Al_2O_3$, $TiO_2$, $SiO_2$, or other coatings may be used to encapsulate the plurality of pillars of the liquid channel 615 with desirable functionality. In some embodiments, the may be bonded with or on a plurality of pillars of the liquid channel 615.

In some embodiments, the mesh 610 may include a woven mesh that may be bonded to the second plurality of pillars of the liquid channel 615 and/or the vapor core 605 through an electroplating process. In some embodiments, the mesh may be a copper woven mesh or a metallic mesh. During this process, for example, the (e.g., woven mesh) may be encapsulated by copper. The top layer 310 with the vapor core 605 and the bottom layer 315 with the liquid channel 615 may be sealed together with the with a mesh in between. After sealing, the TGP 600 may be charged with a working fluid, such as water, methane, ammonia, or other coolants or refrigerants that are compatible with the surfaces exposed to the working fluid.

The liquid channel 615, for example, may include a first plurality of pillars (e.g., electroplated pillars).

The vapor core 605, for example, may include a second plurality of pillars (e.g., electroplated pillars). In some embodiments, the second plurality of pillars in the vapor core 605 may have at least one dimension (e.g., height, width, length, diameter, etc.) that is smaller than at least one dimension (e.g., height, width, length, diameter, etc.) of the second plurality of pillars of the liquid channel 615. The second plurality of pillars may be disposed on the bottom layer 315. The second plurality of pillars may extend to the mesh 610 and/or may not extend to the top layer 310.

In some embodiments, a third plurality of pillars 620 may extend from the bottom layer 315 to the top layer 310. The third plurality of pillars 620 may extend through or around the mesh 620.

In some embodiments, a photo-lithographic patterning process may be used to fabricate the pillars in the liquid channel 615 and/or the vapor core 605. For example, a photo-lithography process may be used to form a plurality of pillars on the top layer 310 to form the vapor core 605 and/or a photo-lithographic patterning process may be used to form a plurality of pillars on the bottom layer 315 to form the liquid channel 615. The photo-lithographic patterning process, for example, may control the positioning and/or the heights of the pillars with a resolution of a few microns. The plurality of pillars on the top layer 310 and/or on the bottom layer 315 may be formed by the mechanical scribing process.

In some embodiments, the thickness of a TGP (e.g., TGP 300 or TGP 600, or any other TGP described in this disclosure) may be a few millimeters or even less than about 500, 450, 400, 350, 300, 250, 200, 150, or 100 microns. For example, the top layer 310 and/or the liquid channel 615) may be 5, 10, 20, 30, 40, 50, 60, etc. microns thick, the wicking structure (e.g.,) may be 5, 10, 20, 30, 40, 50, 60, etc. microns thick, and/or the vapor core (e.g., vapor core 605) may be 10, 20, 30, 40, 50, 75, 100, 125, 150, etc. microns thick.

In some embodiments, a buffer region can be created by design to collect and store any non-condensable gas through passive convection. For example, a space of a few millimeters can be formed in the area outside the mesh (e.g., outside the mesh region shown in FIG. 6). This space can be added prior to bonding. This space may collect any non-condensable gases that would move to this space because of its different density, and thus its effect on evaporation and condensation can be reduced substantially.

Various other sealing techniques may be used such as, for example, thermosonic or thermo-compression bonding, ultrasonic welding, laser welding, electron beam welding, electroplating; solder sealing with alloys with negligible reaction with water; and polymer bonding encapsulated by moisture barrier coatings such as atomic layer deposition (ALD)-based coatings.

Some embodiments may include a pillar-enabled TGP. In some embodiments, the TGP may include a copper-cladded Kapton film that includes three layers. These layers may, for example, include copper and Kapton layers. Each layer may be about 12 μm thick. In some embodiments, a stainless steel woven mesh may be included and may have a thickness less than 75 μm. In some embodiments, the pillars may allow for fluid and/or vapor transport between the pillars under different mechanical loadings.

In some embodiments, a plurality of pillars may be formed on a copper layer (e.g., the top layer and/or the bottom layer) using any of various lithography lithographic patterning processes.

In some embodiments, a copper-encapsulated stainless steel mesh may be sandwiched between the top layer and the bottom layer. The stainless steel mesh, for example, may have a weave that is less than 75 microns in thickness. In some embodiments, the mesh may be copper encapsulated. In some embodiments, the mesh may be hydrophilic. In some embodiments, the reaction of the mesh with water may be negligible.

In some embodiments, a TGP may include a mesh-pillar wicking structure. The mesh-pillar wicking structure may allow the TGP to achieve a low capillary radius (high pumping pressure) in the evaporation regions and/or a higher flow hydraulic radius (low flow pressure drop) in the fluid channel.

In some embodiments, a TGP may include pillars with rounded heads. For example, the pillars may be formed with controlled over-plating. In some embodiments, the pillars may form very sharp angle at the interface between a pillar and the mesh bonded. In some embodiments, these sharp angles may be used, for example, to enhance the capillary pumping force pulling the liquid returned from the condenser to the evaporator.

In some embodiments, a plurality of star-shaped pillars may be constructed on either the top layer and/or the bottom layer that have a star-shaped polygon various cross section.

In some embodiments, a plurality of hydrophilic pillars may be constructed on either the top layer and/or the bottom layer.

In some embodiments, heat rejection through condensation can be distributed throughout the external surface of the TGP.

In some embodiments, pillars and/or spacers may be disposed on a layer with densities (spacing between pillars or spacers) that vary across the layer, with diameters that vary across the layer, with spacing that vary across the layer, etc.

The Figures are not drawn to scale.

The term "substantially" means within 5% or 10% of the value referred to or within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A thermal ground plane comprising:
   a first substrate member comprising copper;
   a second substrate member comprising a metal, wherein the first substrate member and the second substrate member are sealed together so as to be in direct contact and to enclose a working fluid;
   a first plurality of pillars disposed on an interior surface of the first substrate;
   a mesh layer disposed on the top of the first plurality of pillars, wherein the mesh layer comprises at least one of copper, polymer encapsulated with copper, or stainless steel encapsulated with copper, wherein the mesh is entirely disposed in a cavity defined by the first substrate member and the second substrate member; and
   a second plurality of pillars disposed on an interior surface of the second substrate member within an area defined by the perimeter of the second substrate member and the second plurality of pillars extend from the second substrate member to the mesh layer.

2. The thermal ground plane according to claim 1, wherein the second plurality of pillars are not in contact with the first substrate member.

3. The thermal ground plane according to claim 1, wherein the thermal ground plane has a thickness less than 300 microns.

4. The thermal ground plane according to claim 1, wherein the mesh layer is bonded with the first plurality of pillars.

5. The thermal ground plane according to claim 1, wherein the mesh layer comprises at least two mesh layers and each mesh layer comprises the same material as the other mesh layers.

6. The thermal ground plane according to claim 1, wherein the mesh layer comprises at least two mesh layers and each mesh layer comprises a different material than the other mesh layers.

7. The thermal ground plane according to claim 1, wherein a perimeter of the first substrate member and a perimeter of the second substrate member are hermetically sealed together.

8. The thermal ground plane according to claim 7, wherein the hermetical seal is a thermocompression-bonded, an ultrasound-welded, an electrostatic welded, or a laser-welded copper-to-copper interface.

9. The thermal ground plane according to claim 1, wherein the spacing between each pillar of the second plurality of pillars is larger than two times of the diameter of each pillar of the second plurality of pillars.

10. The thermal ground plane according to claim 1, wherein the mesh layer may include a mesh selected from the list consisting of copper mesh, stainless steel mesh, metal mesh, polymer mesh and copper-encapsulated mesh.

11. A thermal ground plane comprising:
a first substrate member comprising at copper and either stainless steel or polymer;
a second substrate member comprising a metal, wherein a perimeter of the first substrate member and a perimeter of the second substrate member are hermetically sealed together so as to be in direct contact, wherein the first substrate member and the second substrate member enclose a working fluid;
a mesh layer bonded with the first substrate member, wherein the mesh layer comprises at least one of copper, polymer encapsulated with copper, or stainless steel encapsulated with copper, wherein the mesh is entirely disposed in a cavity defined by the first substrate member and the second substrate member; and
a plurality of pillars disposed on an interior surface of the second substrate member within an area defined by the perimeter of the second substrate member and the second plurality of pillars extend from the second substrate member to the mesh layer and are not in contact with the first substrate member.

12. The thermal ground plane according to claim 11, wherein the mesh layer comprises at least two mesh layers and each mesh layer comprises the same material as the other mesh layers.

13. The thermal ground plane according to claim 11, wherein the mesh layer comprises at least two mesh layers and each mesh layer comprises a different material than the other mesh layers.

14. The thermal ground plane according to claim 11, wherein the thermal ground plane has a thickness less than 300 microns.

15. The thermal ground plane according to claim 11, wherein the mesh layer may include a mesh selected from the list consisting of copper mesh, stainless steel mesh, metal mesh, polymer mesh and copper-encapsulated mesh.

16. A thermal ground plane comprising:
a first substrate member comprising copper;
a second substrate member comprising a metal, wherein the first substrate member and the second substrate member are sealed together so as to be in direct contact and to enclose a working fluid;
a mesh layer bonded with the first substrate member, wherein the mesh layer comprises at least one of copper, polymer encapsulated with copper, or stainless steel encapsulated with copper, wherein the mesh is entirely disposed in a cavity defined by the first substrate member and the second substrate member; and
a second plurality of pillars disposed on an interior surface of the second substrate member within an area defined by the perimeter of the second substrate member and the second plurality of pillars extend from the second substrate member to the mesh layer and are not in contact with the first substrate member.

17. The thermal ground plane according to claim 16, wherein the mesh layer comprises at least two mesh layers and each mesh layer comprises the same material as the other mesh layers.

18. The thermal ground plane according to claim 16, wherein the mesh layer comprises at least two mesh layers and each mesh layer comprises a different material than the other mesh layers.

19. A thermal ground plane comprising:
a first substrate member comprising copper;
a second substrate member comprising a metal, wherein the first substrate member and the second substrate member are sealed together so as to be in direct contact and to enclose a working fluid;
a mesh layer bonded with the first substrate member, wherein the mesh layer comprises at least one of copper, polymer encapsulated with copper, or stainless steel encapsulated with copper, wherein the mesh is entirely disposed in a cavity defined by the first substrate member and the second substrate member; and
a second plurality of pillars disposed on an interior surface of the second substrate member within an area defined by the perimeter of the second substrate member and the second plurality of pillars extend from the second substrate member to the mesh layer.

20. The thermal ground plane according to claim 19, wherein the mesh layer comprises at least two mesh layers and each mesh layer comprises the same material as the other mesh layers.

21. The thermal ground plane according to claim 19, wherein the mesh layer comprises at least two mesh layers and each mesh layer comprises a different material than the other mesh layers.

* * * * *